United States Patent [19]
Cox et al.

[11] Patent Number: 5,464,984
[45] Date of Patent: Nov. 7, 1995

[54] X-RAY IMAGING SYSTEM AND SOLID STATE DETECTOR THEREFOR

[75] Inventors: John D. Cox, Gainesville; Donald W. Williams, High Springs, both of Fla.

[73] Assignee: General Imaging Corporation, Alachua, Fla.

[21] Appl. No.: 369,813

[22] Filed: Jan. 9, 1995

Related U.S. Application Data

[63] Continuation-in-part of Ser. No. 35,344, Mar. 18, 1993, Pat. No. 5,381,013, which is a continuation-in-part of Ser. No. 750,273, Aug. 27, 1991, Pat. No. 5,220,170, which is a continuation-in-part of Ser. No. 462,042, Jan. 8, 1990, Pat. No. 5,043,582, which is a continuation-in-part of Ser. No. 151,235, Feb. 1, 1988, Pat. No. 4,905,265, which is a continuation-in-part of Ser. No. 807,650, Dec. 11, 1985, abandoned.

[51] Int. Cl.$^6$ .............................. G01T 1/20; G01T 1/24
[52] U.S. Cl. ............... 250/370.11; 250/366; 250/370.09
[58] Field of Search ................................. 250/366, 367, 250/370.09, 370.11, 370.12

[56] References Cited

U.S. PATENT DOCUMENTS

| | | |
|---|---|---|
| 4,322,752 | 3/1982 | Bixby . |
| 4,330,796 | 5/1982 | Anagnostopoulos et al. . |
| 4,543,534 | 9/1985 | Temes et al. .................... 330/9 |
| 4,558,365 | 12/1985 | Ochi . |
| 4,689,487 | 8/1987 | Nishiki et al. ................ 250/361 R |
| 4,765,681 | 7/1988 | Oka ................................ 250/370.01 |
| 4,810,881 | 3/1989 | Berger et al. ................... 250/370.01 |
| 4,980,769 | 12/1990 | Inuiya et al. . |
| 5,043,582 | 8/1991 | Cox et al. ...................... 250/370.09 |
| 5,105,087 | 4/1992 | Jagielinski .................... 250/370.09 |
| 5,194,736 | 3/1993 | Meulenbrugge et al. ...... 250/370.07 |
| 5,220,170 | 6/1993 | Cox et al. ...................... 250/370.09 |
| 5,245,191 | 9/1993 | Barber et al. ................. 250/363.04 |
| 5,274,476 | 12/1993 | Lee . |
| 5,369,281 | 11/1994 | Spinnier et al. ................ 250/370.09 |
| 5,381,013 | 1/1995 | Cox et al. ................... 250/370.11 X |

FOREIGN PATENT DOCUMENTS

| | | |
|---|---|---|
| 0316222 | 5/1989 | European Pat. Off. . |
| 0441521 | 8/1991 | European Pat. Off. . |

OTHER PUBLICATIONS

Imthurn et al., "Bonded Silicon–on–Sapphire Wafers and Devices," 15 Sep. 1992 *J. Appl. Phys.*, pp. 2526–2527.

Aindow, "Interfacial Structure in Heteroepitaxial Silicon on Sapphire," *J. Am. Ceram. Soc.*, vol. 73, No. 5, May 1990, pp. 1136–1143.

Mayer et al., "High–Performance CMOS/SOS Circuits in Spear Material," *IEEE Journal of Solid–State Circuits*, vol. 25, No. 1, Feb. 1990, pp. 318–321.

Carnes, "Sensitivity and Resolution of Charge–Coupled Imagers at Low Light Levels," *RCA Review*, vol. 33, No. 4, Dec. 1972, pp. 607–622.

*Primary Examiner*—Carolyn E. Fields
*Assistant Examiner*—Edward J. Glick
*Attorney, Agent, or Firm*—Foley & Lardner

[57] ABSTRACT

An x-ray detector includes a scintillator, a sensor array, processing circuits, and a ceramic layer. The ceramic layer overlays the processing circuits. The pixel architecture of the detector utilizes a technique similar to a CCD array to shift data from the array. The detector preferably utilizes 4-side abuttable sensor arrays having imbedded shift registers and bond pads superimposed over the pixel array in the upper metallization layers of the sensor. An alternative embodiment incorporates a silicon-on-insulator substrate to produce a monolithic large area substrate and a contiguous uninterrupted pixel array over the entire imaging surface.

27 Claims, 19 Drawing Sheets

IMAGING TILE (ARRAY) BLOCK DIAGRAM

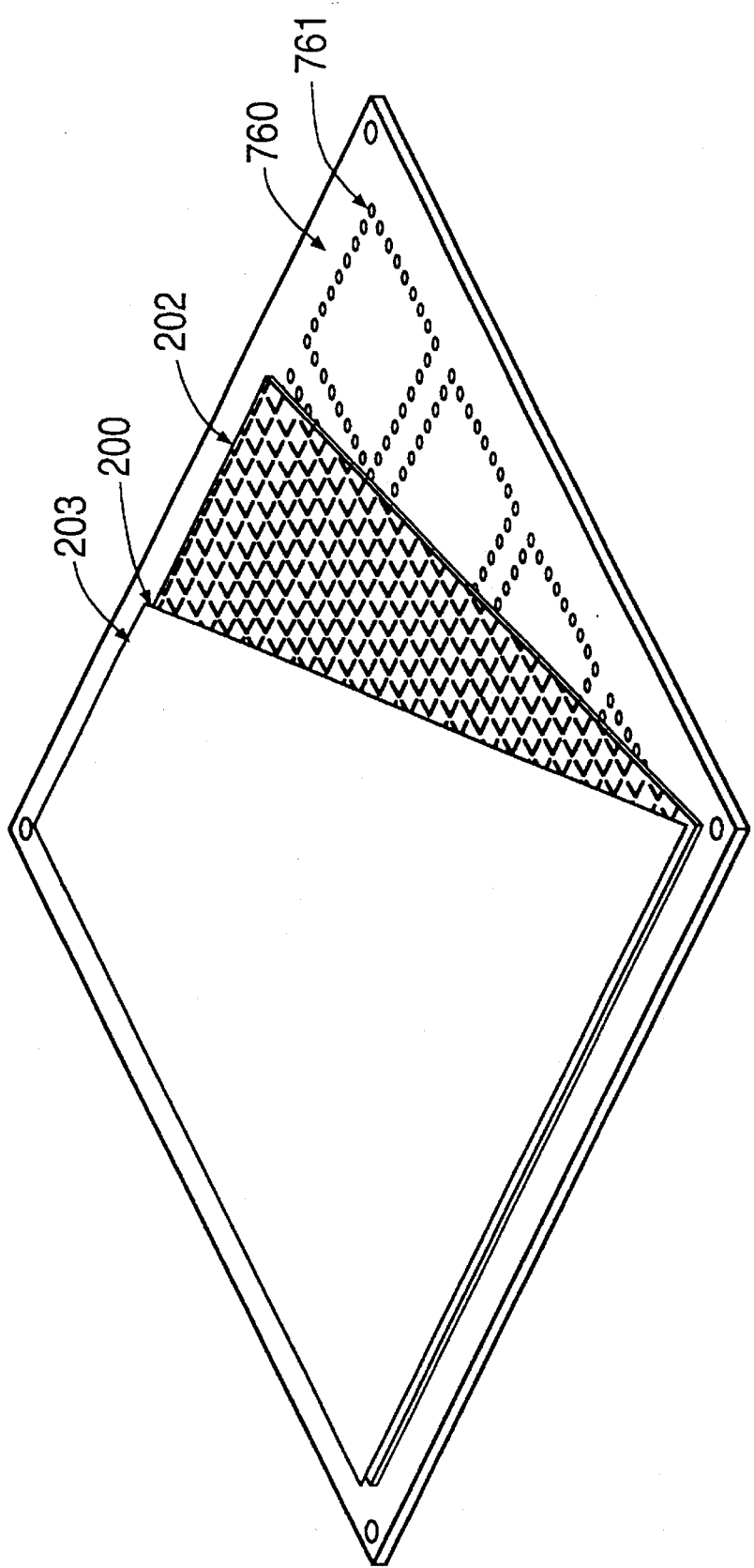

X-RAY IMAGING SYSTEM AND SOLID STATE DETECTOR THEREFOR

CROSS REFERENCE TO RELATED APPLICATIONS

This is a continuation-in-part of U.S. application No. 08/035,344, filed Mar. 18, 1993, now U.S. Pat. No. 5,381,031, which is a continuation-in-part of U.S. application No. 07/750,273, filed Aug. 27, 1991, now U.S. Pat. No. 5,220,170, which is a continuation-in-part of U.S. application Ser. No. 07/462,042, filed Jan. 8, 1990, now U.S. Pat. No. 5,043,582, which is a continuation-in-part of U.S. application No. 07/151,235, filed Feb. 1, 1988, now U.S. Pat. No. 4,905,265, which is a continuation-in-part of U.S. application Ser. No. 06/807,650, filed Dec. 11, 1985, now abandoned.

BACKGROUND OF THE INVENTION

1. Field of the Invention

This invention relates to x-ray imaging systems and to x-ray sensors for use in such systems.

2. Discussion of Related Art

Presently, large area imaging devices require highly parallel readout architectures in order to provide real-time frame rates and reduced image readout noise. However, parallel readout architectures commonly employ horizontal and vertical clocks and output shift registers that require non-imaging area on the imaging array surface.

For example, U.S. Pat. No. 4,322,752 to Bixby discloses methods and apparatus for readout of an area image sensor at greatly increased frame rates by the formatting of the sensor into blocks of photosite rows and by modifying the method of sensor readout in a manner compatible with such format.

U.S. Pat. No. 4,330,796 to Anagnostopoulos discloses a conventional area image sensor of the interline transfer type that is configured to be readable in blocks of adjacent photosite rows thereby enabling the modified sensor to be read out at fast frame rates.

For large-area x-ray imaging applications it would be highly desirable to produce imaging arrays that have no contiguous non-imaging areas. It would also be desirable to keep the cost to manufacture the arrays to a minimum. Assembling a large-area array from a single layer of bulk silicon is cost prohibitive, requiring the use of a mosaic or tiling procedure constructing the large-area array from smaller imager tiles or sensors.

U.S. Pat. No. 4,689,487 to Nishiki discloses a large-area x-ray detector array consisting of a photodiode array made of polycrystalline or amorphous semiconductor material.

U.S. Pat. No. 4,810,881 to Berger discloses a large-area amorphous silicon x-ray detector. Each pixel of the detector includes an amorphous silicon diode that is conductively connected in series to a capacitor which in turn are both then conductively connected to the drain of an amorphous silicon base junction field effect transistor.

European Patent Application No. 0,441,521,A1 to Tri Tran, discloses a large-area solid-state x-ray imaging device containing an array of amorphous silicon Schottky barrier diodes.

While amorphous silicon arrays offer contiguous sensing capability over large areas and are relatively inexpensive to fabricate, amorphous silicon suffers from low carrier mobility and lifetime due to the large number of unbound silicon atoms in the material. Amorphous silicon is usually hydrogenated to bind hydrogen to the silicon atoms increasing the carrier lifetime and mobility and improving the quality of the semiconductor as an imaging device. These silicon-hydrogen chemical bonds are easily broken by incident ionizing radiation such as x-rays. Consequently, hydrogenated amorphous silicon arrays must be protected from x-rays in order to maintain detector performance levels over an extended radiation exposure history.

It would be advantageous to construct large-area x-ray imaging arrays out of a semiconductor material that did not suffer from radiation exposure yet provide contiguous imaging area and was relatively inexpensive to fabricate.

Silicon on Insulator (SOI) technology has been studied and developed as an alternative to bulk silicon technology. SOI technology has many inherent advantages over bulk silicon. SOI substrates have an inherent speed advantage over comparable bulk silicon substrates due to the reduction in junction capacitance resulting from the insulating substrate. The isolation afforded by the insulating substrate has also proven to increase the resistance of circuits to the effects of ionizing radiation. This process is discussed in "High-Performance CMOS/SOS Circuits in SPEAR™ Material", by Donald C. Mayer, et al, *IEEE Journal of Solid-state Circuits*, Vol. 25, No. 1, pgs. 318–321, February, 1990.

The dominant SOI technology today is Silicon on Sapphire (SOS). In this process, a thin epitaxial film of silicon is deposited on a single-crystal $\alpha$-aluminum oxide substrate by chemical vapor deposition (CVD). Despite its widespread use, SOS suffers from high defect density in the silicon film. These defects include microtwins, stacking faults and threading dislocations. New techniques such as double solid-phase epitaxy and recrystallization have made significant improvements in film quality and SOS films can now be produced with crystalline quality approaching that of bulk silicon. This process is discussed in, "Interfacial Structure in Heteroepitaxial Silicon on Sapphire", by Mark Aindow, *Journal of the American Ceramic Society*, 73(5), 1136–1143, 1990.

Recrystallization and regrowth techniques are also being applied to amorphous silicon films on an insulator substrate as well. The entire field of SOI technology is currently undergoing an explosive growth and high quality films of SOI substrates are being produced with a quality approaching that of bulk silicon with a manufacturing cost approaching that of amorphous silicon.

Wafer bonding of silicon wafers on sapphire substrates has also been studied as a method of producing SOS materials with combined qualities of bulk silicon and SOI substrates. This process is discussed, for example, in "Bonded silicon-on-sapphire wafers and devices", by George P Imthurn, et al, *Journal of Applied Physics*, 72(6), pgs. 2526–2527, September, 1992.

SUMMARY OF THE INVENTION

One object of the present invention is to provide an x-ray detector which has a high quantum efficiency to detect low x-ray doses.

Another object of the present invention to provide an x-ray detector which has the capability of withstanding a large number of exposures without undergoing a degradation in performance.

In accordance with the above and other objects, the invention comprises a scintillator for converting impinging x-rays into visible light; a sensor array having two opposed surfaces with a plurality of detectors at one of the surfaces and having the other of the surfaces facing the scintillator; and a plurality of processing circuits facing the one surface and connected to the detectors by bump bonds.

In accordance with other aspects of the invention, the bump bonds each comprises a first bump on the sensor array, a second bump on the processing circuits and a third bump therebetween.

In accordance with other aspects of the invention, the scintillator comprises a glass plate doped with a phosphor. Alternately, the scintillator may be in the form of a fiber optic fiber, the core of which is doped with a phosphor. Another possibility is that the scintillator is in the form of a crystal phosphor deposited on the sensor array.

The device may also include a first mechanical support connected to the phosphor and a second mechanical support connected to the processing circuits.

Sense and data lines for the detector may be positioned between the sensor array and the processing circuits.

In accordance with other aspects of the invention, the detector comprises a plurality of semiconductor sensors comprising respective MOS capacitors; a gain stage in close proximity to each of the semiconductor sensors for receiving and amplifying charges from the MOS capacitors; and switches positioned to direct charge from the MOS capacitors to the gain stages. A separate gain stage may be provided for each MOS capacitor or one gain stage can be connected to different ones of the capacitors through the switches.

In accordance with other aspects of the invention, the detector comprises an array of 4-side abuttable 5 cm×5 cm silicon sensor tiles containing an array of charge storage devices; imbedded shift registers and bond pads in the upper metallization layers bonded to a ceramic substrate; a ceramic backplane containing a metallization layer connected to the detectors by bump bonds, solder bumps or tab bonding techniques.

In accordance with other aspects of the invention, the sensor array comprises a silicon-on-insulator substrate having two opposed surfaces with a plurality of detectors at the silicon surface and having the insulator surface facing the scintillator; and a plurality of processing circuits facing the one surface and connected to the detectors by bump bonds. The silicon-on-insulator substrate can be made by growing a high-quality epitaxial silicon layer on a transparent insulator layer; by bonding a silicon wafer on to a insulator crystal substrate; or by crystallizing an amorphous silicon layer on an insulating substrate.

The insulator substrate is made of a transparent (to visible light) material such as sapphire, diamond or other crystalline substance with a crystalline structure and mechanical properties close to that of silicon. Alternately, the insulator can be made of an amorphous material such as glass where an amorphous layer of silicon is crystallized to form a high-quality semiconductor layer.

There also may be a circuit for connecting several of the capacitors to one gain stage to add the outputs from the several capacitors and produce a lower resolution real time image, or to connect the several capacitors sequentially to the gain stage to produce a higher resolution static image.

The gain stage preferably comprises a capacitor having a smaller capacitance than the capacitor in the sensor.

The device also includes a circuit for transferring packets of charge from a sensor to a gain stage several times during one exposure cycle.

The foregoing embodiments of the present invention provide excellent sensitivity suitable for medical applications. The intrinsic sensitivity and cost of the sensor array can be improved by increasing the pixel fill factor, decreasing the power consumption required by the array, simplifying the pixel read-out architecture and the vertical integration packaging design.

BRIEF DESCRIPTION OF THE DRAWINGS

The above and other objects of the invention will become more readily apparent as the invention becomes more fully understood from the detailed description to follow, reference being had to the accompanying drawings in which like reference numerals represent like parts throughout, and in which:

FIG. 21 is an alternate embodiment of the detector shown in FIG. 18.

DETAILED DESCRIPTION OF THE PREFERRED EMBODIMENTS

As discussed above, U.S. Pat. No. 5,043,582 to Cox et al., incorporated herein by reference, discloses a number of sensor architectures with a detailed discussion of their operation and use in a complete system. These architectures operate satisfactorily to collect charge to form an image. However, there is always a need to improve the operation of such sensors. Disclosed herein are a number of different devices which can be used in the Cox et al system.

Figure 16:
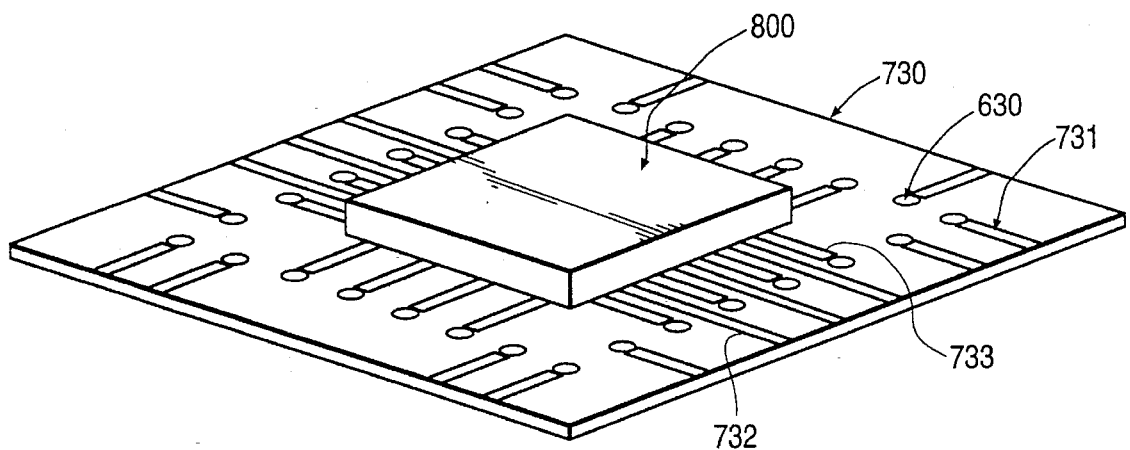
FIG. 16 is an isometric drawing of the ceramic substrate of a 5 cm×5 cm sensor tile containing metallization layers and a ASIC processor array.

One sensor architecture of the Cox et al. patent is depicted in FIG. 16 of the patent. This sensor comprises a sensor array formed of MOS capacitors which face a scintillator. On the opposite side of the scintillator is a preprocessor array. In order to improve the charge collection and transfer capabilities of the Cox et al sensor, a more sophisticated pixel architecture is required. The MOS capacitor has excellent detector capabilities and can efficiently collect charge generated as a result of x-ray interaction within the absorber layers. However, it is equally important to be able to efficiently transfer that charge to the preprocessor arrays for digitization and processing. The amount of charge collected by each capacitor is very small and must be transported large distances (by semiconductor standards) to the preprocessor array. The charge transfer efficiency of the sensor array can be improved by the addition of a gain stage and impedance matching elements within the pixel. By amplifying the voltage produced by the charge collected on the MOS capacitor, a larger signal will be transferred. By matching the impedance of the pixel to the sense line, a more efficient charge transfer will occur. These changes will improve the performance of the device substantially.

Figure 1:
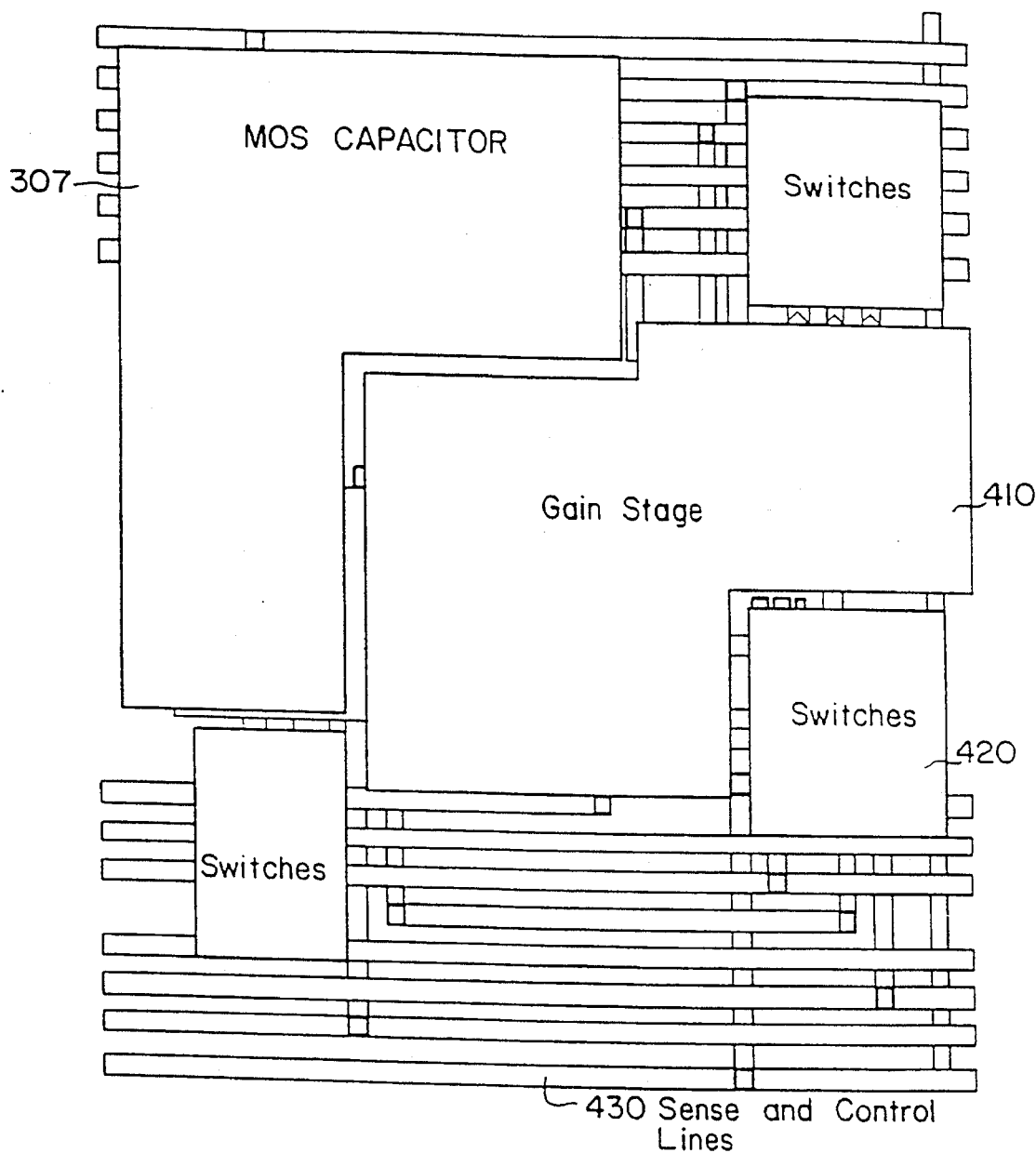
FIG. 1 is a plan view of an x-ray pixel configuration according to the present invention.
Figure 2:
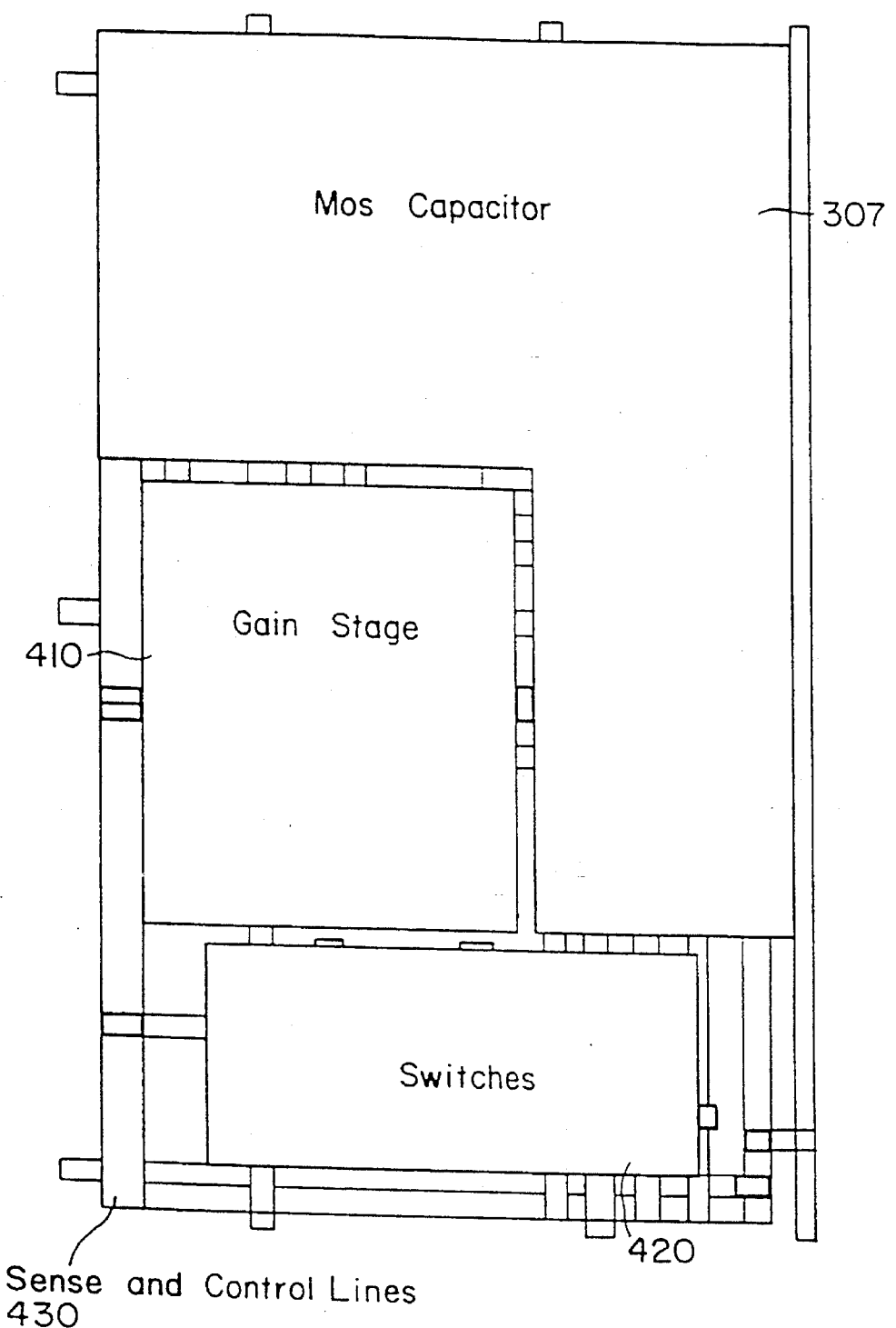
FIG. 2 is a plan view of another x-ray pixel configuration according to the present invention.

A diagram of the improved pixel architecture is shown in FIG. 1. As shown, the pixel area is shared by the MOS capacitor 307, the gain stage 410, a set of switches 420 and the required sense and control lines 430. The added pixel components improve the charge transfer efficiency of the pixel at the expense of fill factor. Fill factor is the ratio of the sense area (i.e., MOS capacitor area) of the pixel to its total area. Clearly, a higher fill factor will improve the sensitivity and charge collection efficiency of the pixel. A balance must be struck between improved charge transfer efficiency and reduced charge collection efficiency (sensitivity). It is therefore important to provide the improved charge transfer efficiency capabilities to the pixel without greatly reducing its fill factor. FIG. 2 shows a pixel architecture with a higher fill factor. This is accomplished by utilizing smaller components that may not produce the best charge transfer characteristics but have improved fill factor and sensitivity characteristics. The larger components used in the embodiment of FIG. 1 could, for example, be operational amplifiers. These take up substantial space but have very good transfer characteristics. The smaller components used in the embodiment of FIG. 2 could be inverters. These take up considerably less space but have poorer charge transfer characteristics.

Figure 3:
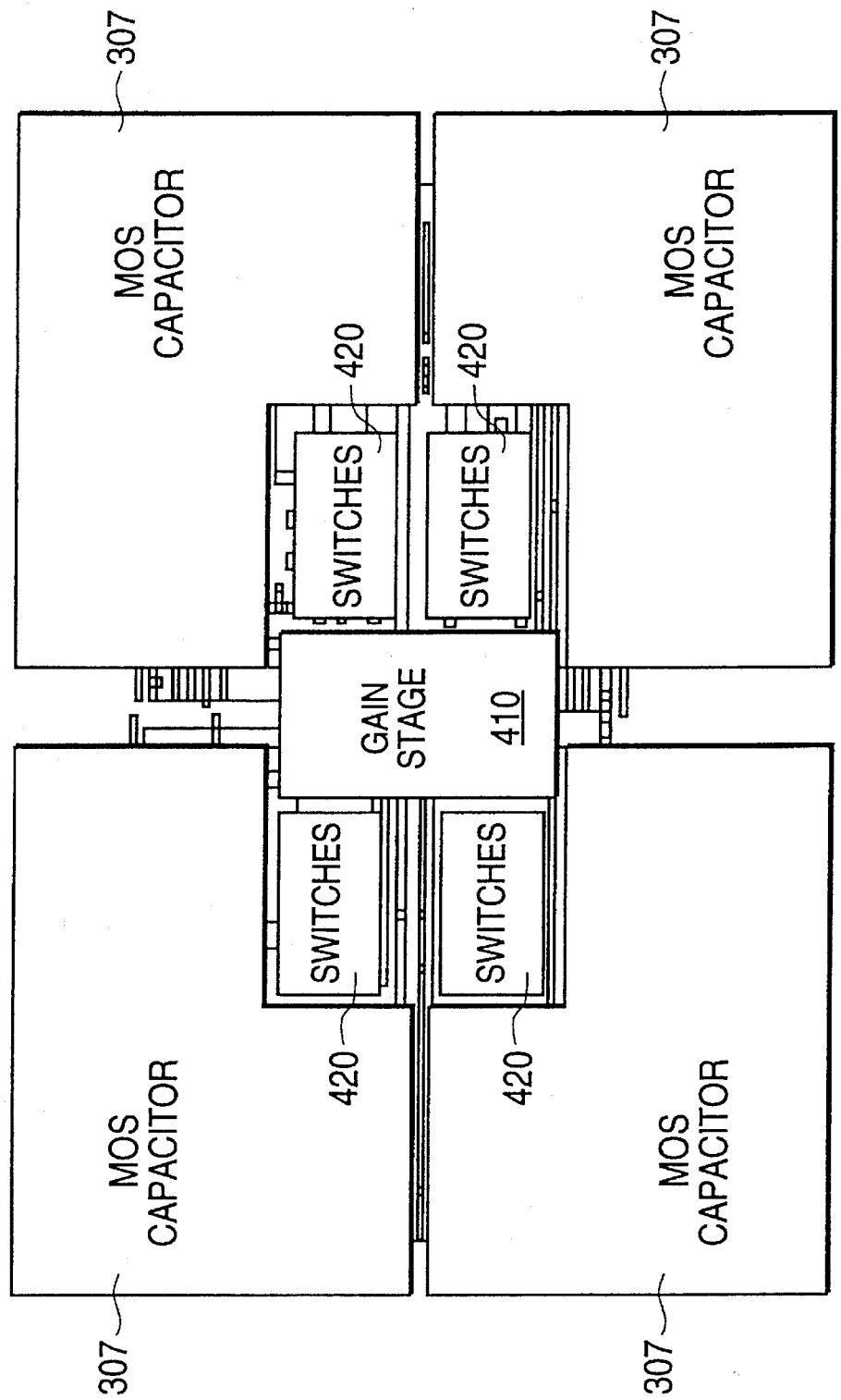
FIG. 3 is a plan view of a third x-ray pixel configuration according to the present invention.

In yet another embodiment of the improved pixel architecture, the gain stage 410, switches 420 and sense and control lines 430 are shared by neighboring pixels. In FIG. 3, a 2×2 pixel ensemble is shown where the gain stage 410 is placed in the center of four neighboring pixels and is connected through switches 420 to the four MOS capacitors 307. In this shared amplifier configuration, the fill factor can be even further improved and yet another advantage can be gained, namely, that the neighboring pixels can be summed and averaged or can be read out sequentially. The advantages of this configuration are that the device can be read out at high speed when all four pixels are averaged together to produce a lower resolution real-time (i.e., 30 frames per second) image or the pixels can be read out sequentially for a higher resolution static image. Now the device is capable of producing two types of x-ray imaging techniques (high resolution static and lower resolution real-time).

Figure 4:
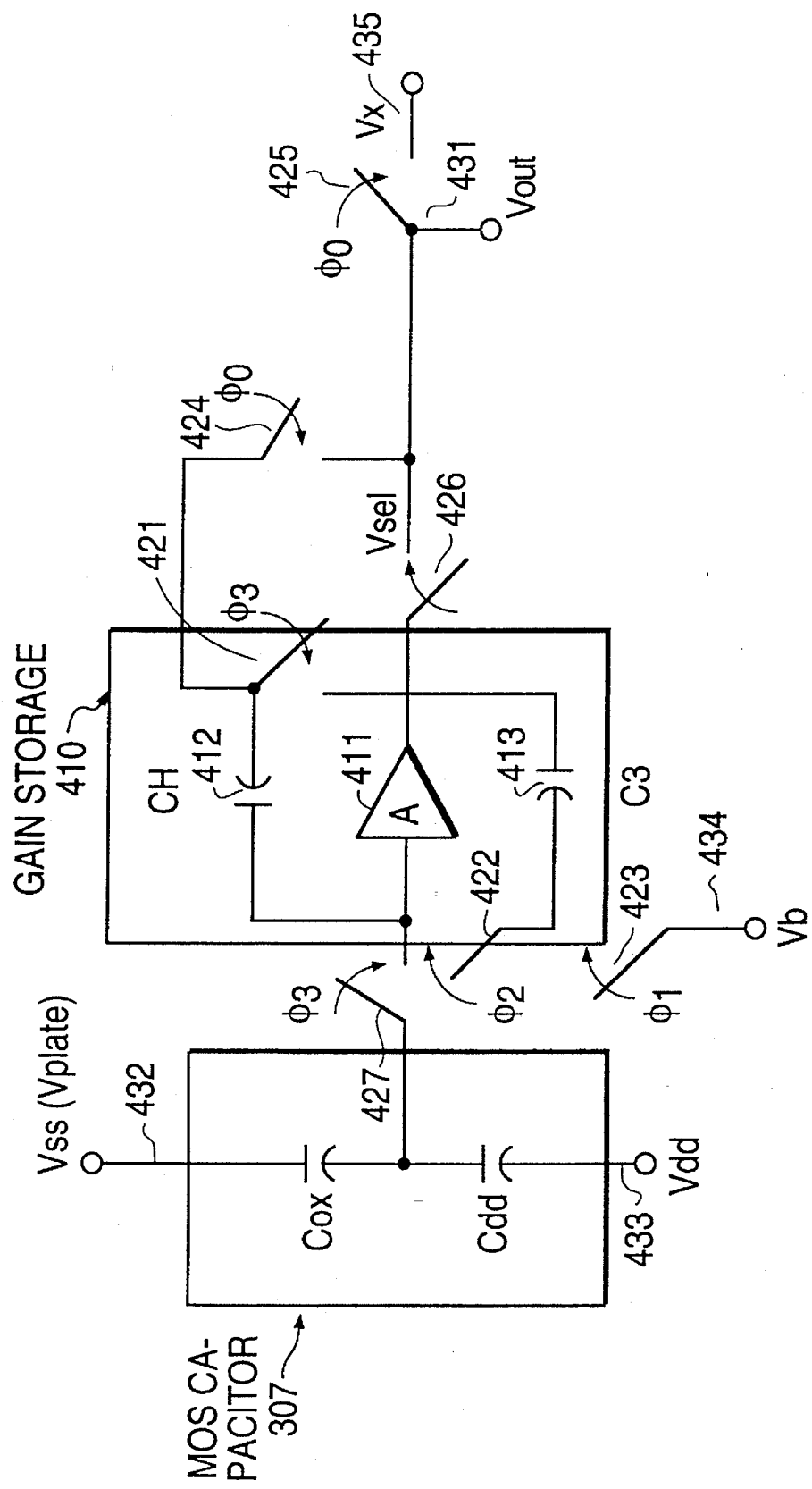
FIG. 4 is a schematic representation of an equivalent circuit for a pixel according to the present invention.

A schematic of the improved pixel architecture is shown in FIG. 4. As shown, the MOS capacitor 307 is modeled as two capacitors in series (the capacitance of the oxide layer and the substrate have distinct properties that require two separate capacitors to adequately describe). The MOS capacitor is connected to the gain stage 410 by switch 427. In the embodiment having several MOS capacitor connected to the same gain stage, plural switches 427 would be provided. The gain stage 410, is shown as an operational (Op) amplifier 411 connected to a storage capacitor (CH) 412 and a feedback capacitor (C3) 413 by a set of switches 421 and 422. The gain stage 410 is connected in turn to the MOS capacitor 307 and sense line 431 by switches 422, 423, 424, 425 and 426. Control lines 432 and 433 supply power to the MOS capacitor 307. Control line 434 is used to charge the storage capacitor 412. Control line 435 is used to address the pixel. The gain from the gain stage is principally obtained by the ratio of capacitances between the MOS capacitor 307 and the storage capacitor 412. The capacitance of the MOS capacitor is on the order of 10 to 20 times larger than that of the storage capacitor. Thus, when charge is transferred between the two, the quantity of charge in the storage capacitor produces a larger voltage than in the MOS capacitor.

Because of the smaller capacitance of the storage capacitor 412, impedance matching with the data line becomes necessary. This impedance matching is effected by the feedback capacitor 413. Capacitor 413 also assists in the read out of data from the gain stage as well as reduces the slew rate requirement of the operational amplifier 411. In addition, capacitor 413 improves the finite gain sensitivity of the operational amplifier 411.

The gain circuit 410 together with its associated switches form an offset compensated switched capacitor circuit. The details of such a circuit are set forth in U.S. Pat. No. 4,543,534 to Temes et al., which is hereby incorporated by reference.

As discussed above, operational amplifier 411 as shown in FIG. 4 is used in the embodiment of FIG. 1. Smaller components such as an inverter may be used in the embodiment of FIG. 2. In either case, the ratio between the MOS capacitor and the storage capacitor determines the gain. Also, in either case, impedance matching is needed.

Since the storage capacitor 412 stores charge during the exposure interval, it is important that the capacitor be insensitive to light generated by the phosphor. To accomplish this, the storage capacitor 412 should have both of its electrodes made out of polysilicon creating what is known as a double-poly capacitor. These types of capacitors are relatively insensitive to radiation. The fact that the sensor arrays 404 are illuminated from the substrate or back side further isolates the storage capacitor 412 from radiation since it does not reside on or in the substrate or epitaxial layer. In other words, the double-poly capacitor is formed from two polysilicon electrodes grown on the epitaxial layer, removing it from the radiation on the back or substrate side.

Another concern about the overall sensing capabilities of the pixel is the performance of the gain stage 410. To optimize the performance of the op amp 411 within the gain stage it is important to reduce its slew-rate requirements. The feedback capacitor 413 in the gain circuit acts to limit the voltage swing the amplifier 411 must experience as it switches from state to state. To keep a high fill factor in the pixel 400, a simple gain stage is required to reduce the area occupied by non-sensing elements. This creates limitations on the gain-stage performance, necessitating low-gain amplifiers or simple inverters. The use of the feedback capacitor has the advantage when used with a low-gain amplifier that it reduces the signal loss that is normally experienced with low gain amplifiers.

Yet another concern about the sensing capabilities of the pixel 400 is the linearity of the MOS sensing capacitor 307. When charge is accumulated in the capacitor, the depletion layer shrinks, reducing the volume available for further charge collection. This results in a non-linear sensitivity since the ability of the capacitor to collect charge is related to the volume of its depletion region. One way to mitigate this problem is to shift the charge collected on the MOS capacitor 307 to the storage capacitor 412 many times during the exposure. Each time this is done, the MOS capacitor 307 is reset to its deep-depletion state, improving the linearity of its response to radiation. This technique is shown in the pixel charge-expose-read cycle in FIGS. 5a–5e.

Figure 5C:
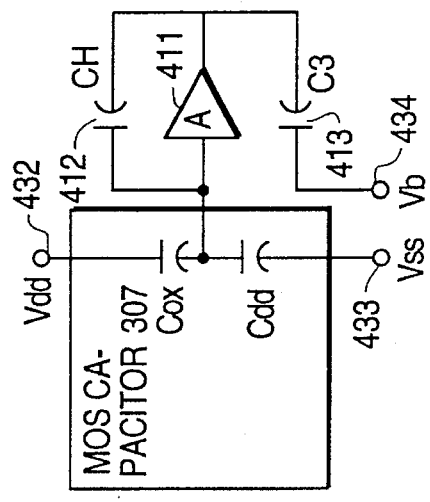
FIGS. 5a–5e show the charge-expose-read cycle of the pixel of FIG. 4.
Figure 5B:
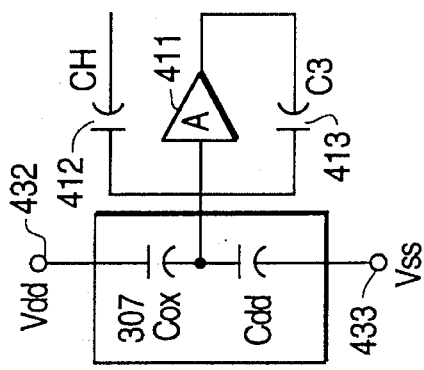
Figure 5A:
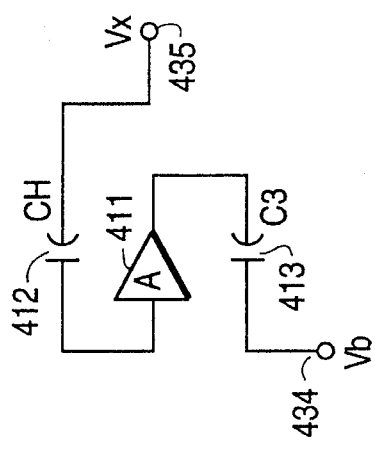
Figure 5E:
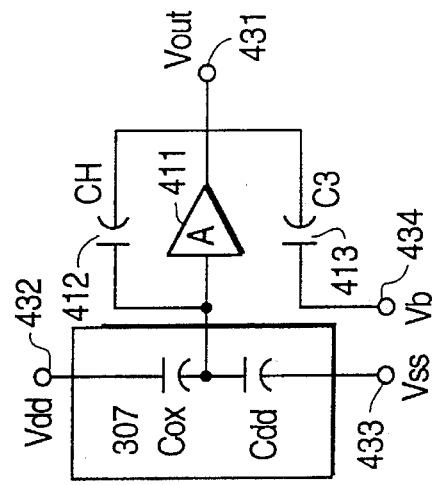
Figure 5D:
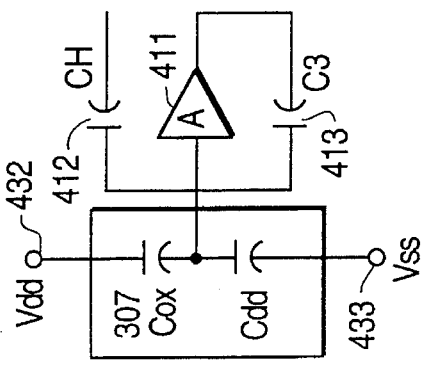

The pixel charge-expose-read cycle has five sequential steps. The first step is to precharge the storage capacitor 412, as shown in FIG. 5a. The second step is to precharge the MOS capacitor 307 as shown in FIG. 5b. The third step is to expose the MOS capacitor 307 to x-rays for the purposes of acquiring the image, as shown in FIG. 5c. The fourth step is to transfer packets of charge from the MOS capacitor 307 to the storage capacitor 412 many times during the overall expose portion of the charge-expose-read cycle, as shown in FIG. 5d. The fifth step is to read out the accumulated and amplified charge, as shown in FIG. 5e.

Figure 6:
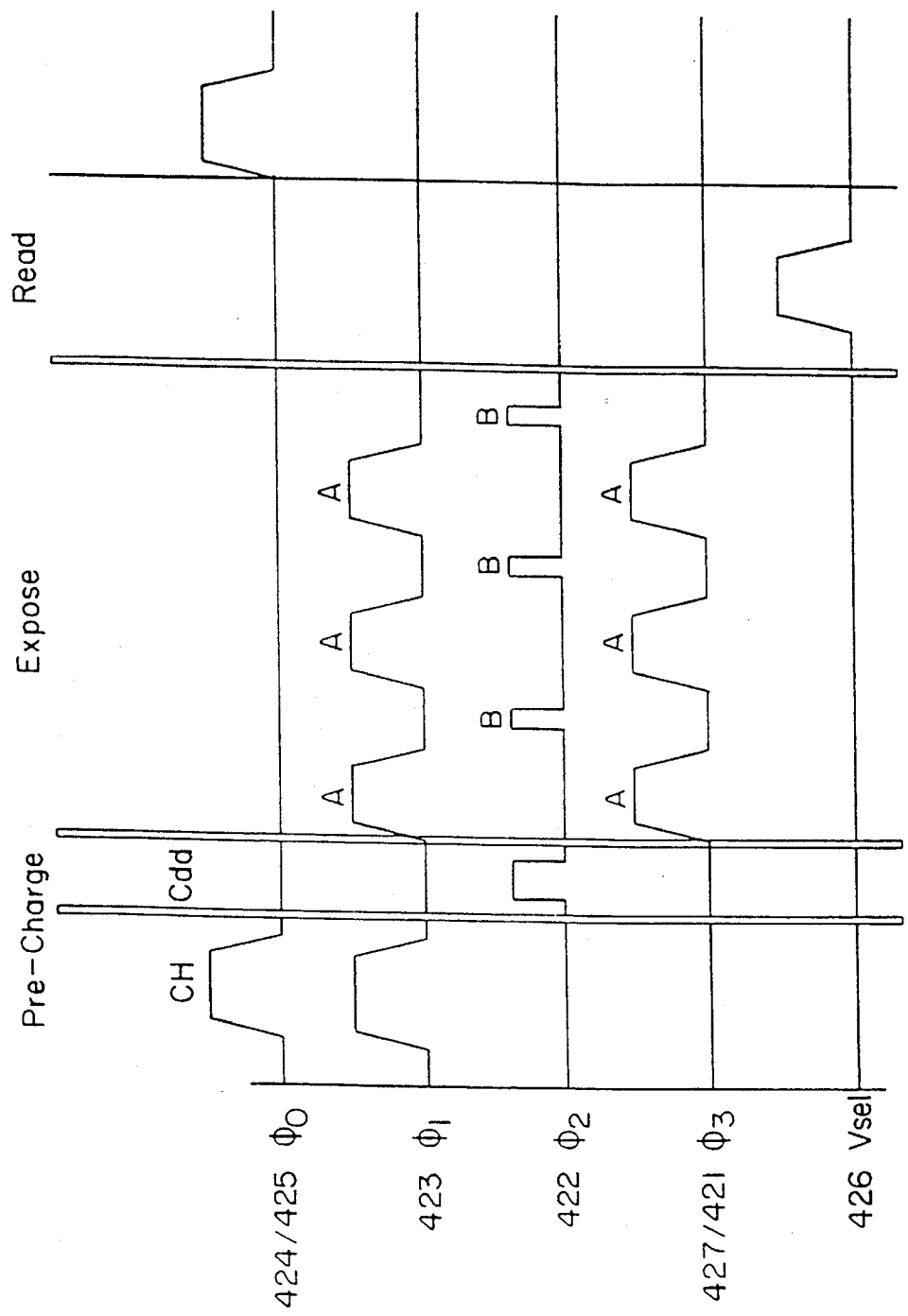
FIG. 6 is a timing chart for the charge-expose-read cycle of FIGS. 5a–5e.

FIG. 6 shows a timing diagram for the charge-expose-read cycle. As shown, there are seven clocks, 421 through 427 that are switched on and off accordingly to produce the five stages of the cycle. Also shown is the relative amount of time spent for the two portions (A and B) of the exposure interval. The large majority of the time spent in the exposure interval is charge accumulation in the MOS capacitor, whereas only a small portion (<10 per cent) of the time is spent dumping charge onto the storage capacitor 412. This is done to minimize the amount of time required to obtain an image.

Figure 14:
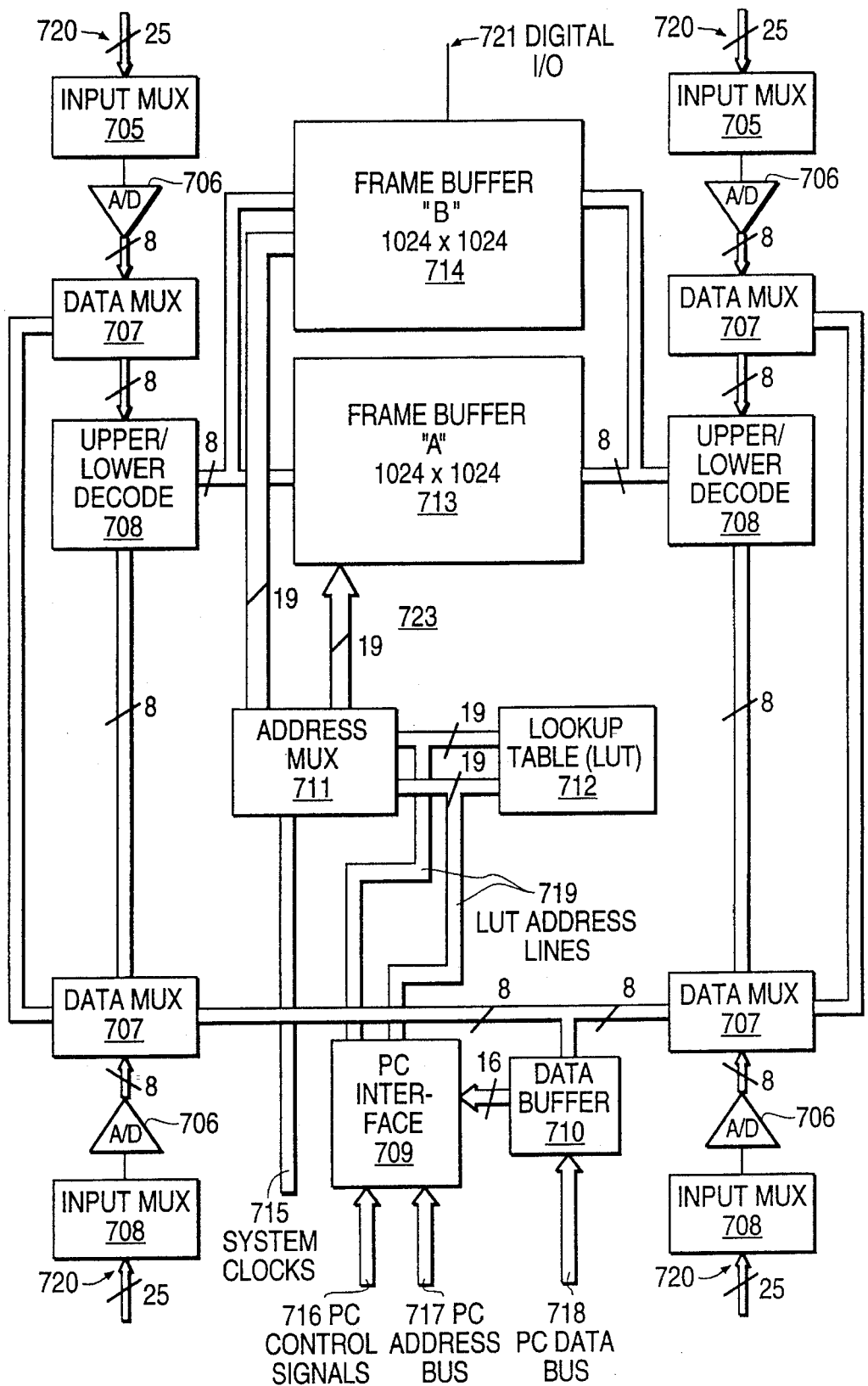
FIG. 14 is a block diagram of the preprocessor circuitry that is located on the backplane of the x-ray detector according to a further embodiment of the present invention.

The improved pixel of the present invention can be used as the sensing element in the random access sensor disclosed in the Cox et al. patent FIG. 14, using the same row, column and signals lines used in regard to other pixel architectures. It will be understood by those skilled in the art that clock lines needed to implement the clock signals of FIG. 6 can easily be implemented using known technology. The manner of implementing control lines for effecting high resolution static or low resolution real time operation, discussed in connection with the embodiment of FIG. 3, would also be obvious to one skilled in the art.

The foregoing embodiments of the pixel architecture of the invention provide improved performance to the invention but further improvements to the sensitivity and longevity of the invention can be made by changing the architecture of device structure itself. Accordingly, the sensitivity and longevity of the sensor array is improved by reversing the positions of the phosphor and the sensor array as in detector 500 shown in FIG. 7 from those shown in FIG. 16 of the Cox et al. patent. In the configuration shown in FIG. 7, the phosphor is facing the x-ray source. In this configuration the phosphor thickness is not constrained by the fact that solder connectors need to be passed through it, as in the Cox et al. structure, limiting its practical thickness. Recent advances in phosphor doped fiberoptic plates have produced thick absorber plates that possess high resolution because of the light guiding properties of the fiberoptics. A thick phosphor that has high resolution is of particular interest to solid-state imaging applications where the added shielding properties of a thicker absorber are needed to protect the semiconductor components underneath while preserving high resolution imaging capabilities. The added shielding capabilities of the thicker phosphor in this configuration will increase the life of the sensing array, thus improving its cost competitiveness with other imaging modalities. The increased absorption properties of the thicker phosphor will improve the sensitivity of the sensor array, reducing the x-ray dose needed to obtain an image, producing yet another advantage particularly in medical applications where patient dose is of concern.

The thickness of the phosphor depends on the manner of its application. A fiber optic scintillator, in which the core of an optic is doped with a phosphor, can be on the order of 6–8 mm. This is an excellent type of scintillator for use in the present invention since the optic fiber guides the output to the sensor array with no light scattering. If a phosphor crystal is deposited on the back of the sensor array, the thickness of the phosphor layer would be on the order of 0.1–0.5 mm. Scintillator screens, on the other hand may be on the order of 2–3 mm.

Figure 7:
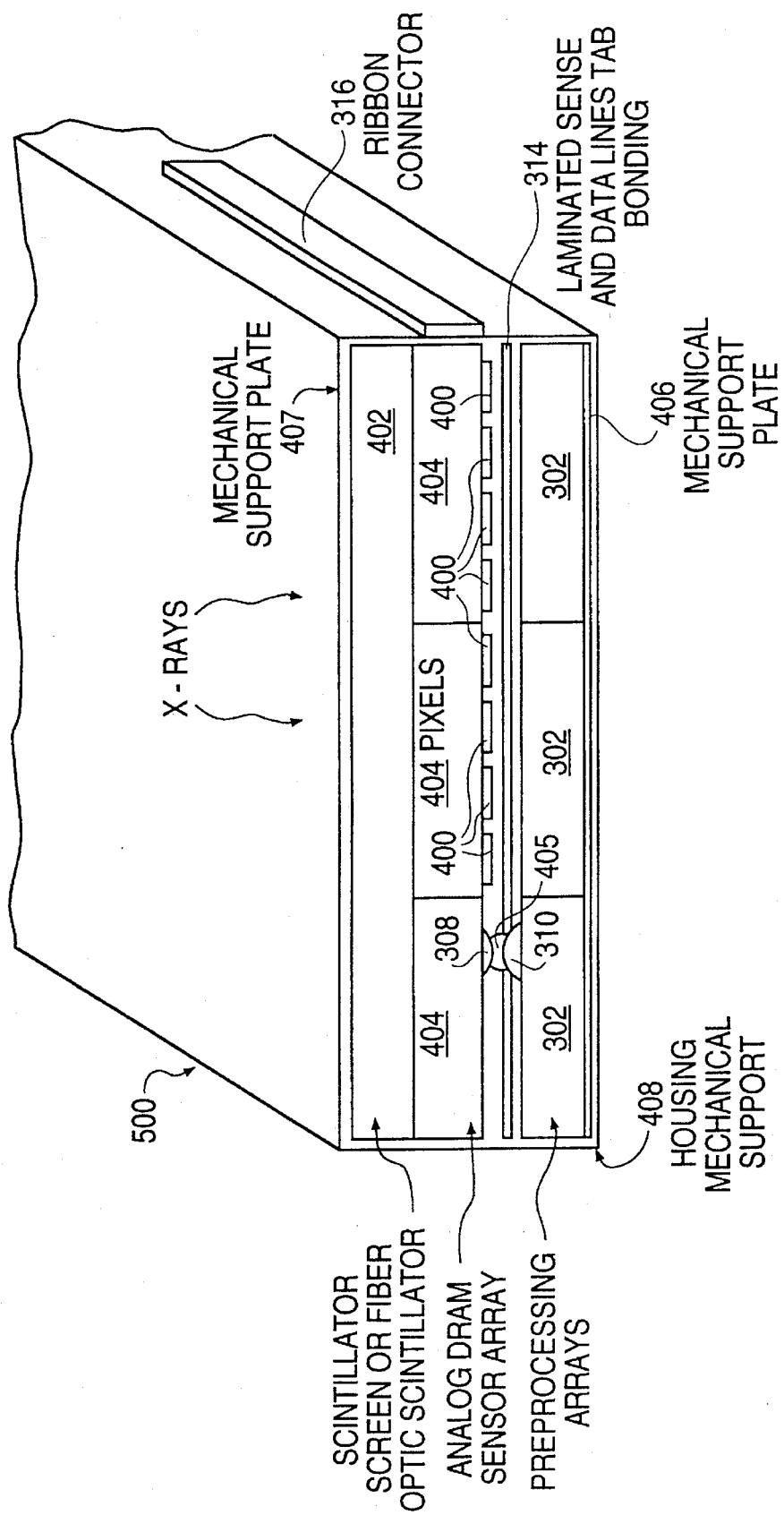
FIG. 7 is a cross sectional view of a detector configuration according to the present invention.

As shown in FIG. 7, the detector 500 comprises a first mechanical support 407, a preprocessor array having a plurality of preprocessor chips 302 mounted on the mechanical support 406, and sensor arrays 404 mounted directly on the phosphor 402. Each sensor array 404 contains a plurality of pixels 400 interconnected by control and sense lines 430 similar to the arrangement shown in FIG. 14 of the Cox et al. patent. Solder bumps 308 are connected to control and signal lines also depicted in FIG. 14 of Cox et al. with respect to solder bumps 208. The solder bumps 308 are connected to solder bumps 310 on the preprocessors via gold and/or solder connectors 405. This provides a multilayer structure wherein the MOS capacitors 307 can be randomly accessed yet be closely spaced by virtue of the solder bump connections which avoid "dead spaces" in the resulting image by communicating the control and sense lines of the sensor array out of the arrays to the preprocessors. The preprocessors 302 communicate externally of the detector 500 through tab bonded laminated sense and data lines 314. The tab bonding comprises a thin piece of plastic with the sense and data lines laminated therein. The tab bonding connects to a ribbon connector 316 which connects to a processor such as a PC or other such image processor which extracts data and supplies power to the imager. The sense and data lines from the tab bonding may be attached to the preprocessor or may attach directly to solder bumps leading to the sensor arrays 404.

The foregoing characteristics of detector 500 are similar to the detector 300 of FIG. 16 of Cox et al., except that the sensor arrays 404 and the phosphor 402 are reversed (i.e., the phosphor is directly exposed to the x-rays whereas in detector 300 the sensor array 304 is directly exposed to the x-rays). The other main difference between these structures is that the sensor array 404 has a thinned epitaxial layer and is back-lit by the phosphor 402. Thinning the epitaxial layer of a sensor array is a technique known in the art as a way of improving the sensitivity and quantum efficiency of a visible light detector. This process has the effect of making the detector array more expensive but is justified in many cases where the incident radiation is weak. In the case of x-ray imaging in the configuration of detector 500, the detector will have a much longer useful life and will be more sensitive, thus justifying the added expense. Moreover, the reversal of the sensor array 404 and the phosphor 402 eliminates any obstruction between the sensor array 404 and the preprocessor array 302 as is the case with detector 300. By removing the obstruction (the phosphor 320), it will be much easier to make the required connections between the sensor array 404 and the preprocessor 302.

Figure 13:
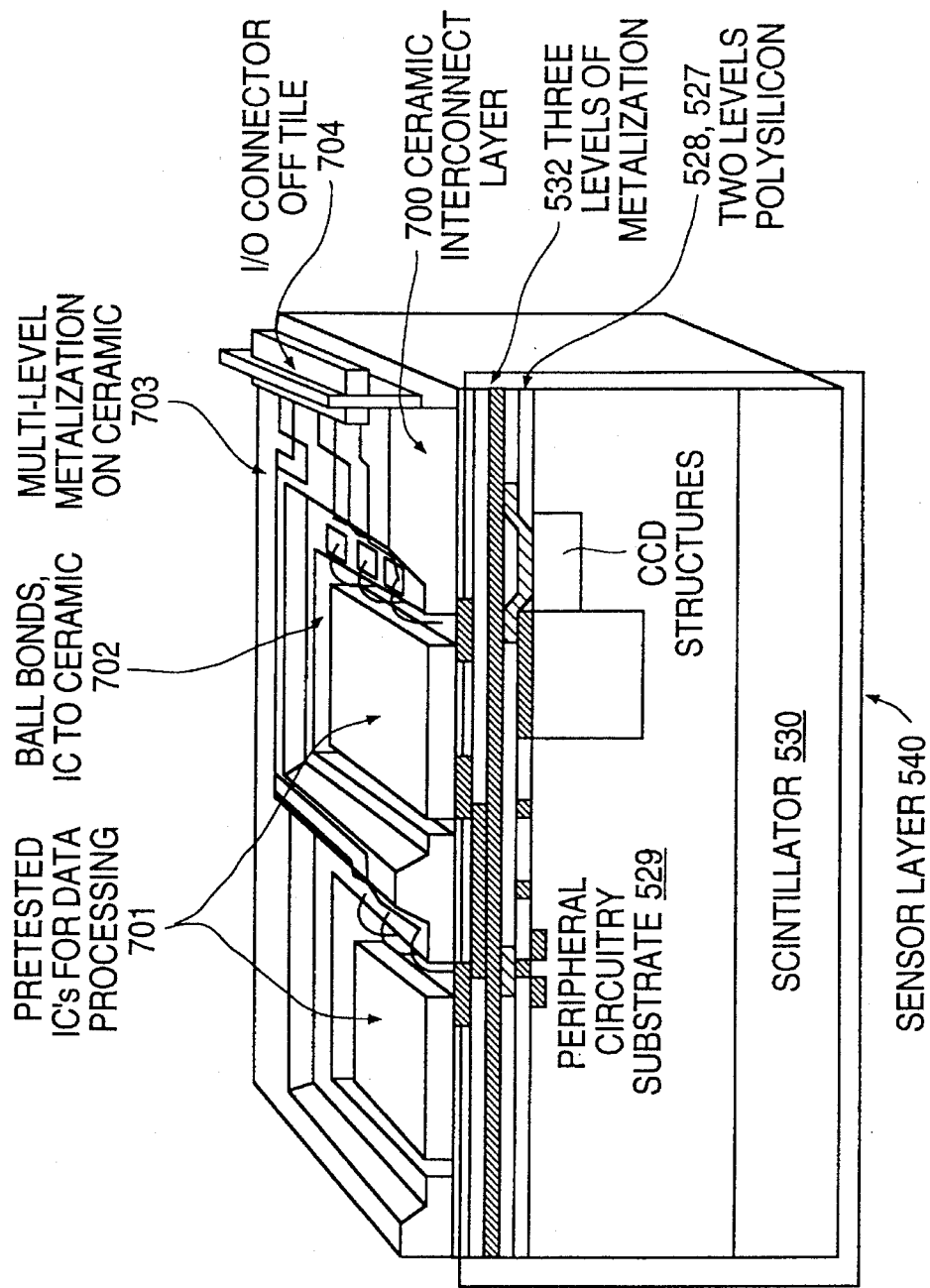
FIG. 13 is a cross sectional view of the tile packaging according to a further embodiment of the present invention.

The sensor of the present invention is produced with an epitaxial layer on a substrate, similar to that shown in FIG. 13 of the Cox et al patent except without the extra absorber. The substrate is removed and the epitaxial layer is grown to a maximum or is thinned to a maximum of 20 microns. The epitaxial layer should be doped to provide a 20 Ohm-cm resistance.

Because the MOS capacitors in the present embodiment are illuminated through the thinned epitaxial layer of the sensor array, it is no longer important that the top surface of the capacitor be unobstructed. All of the required circuits can be routed over the capacitors or any other structure in the sensor array 404. This is an important advantage that will permit the sense and control lines 430 to be routed in such a way as to reduce the path length required to connect the circuits together.

The sensor arrays 404 are preferably arrays of pixels 400 which consist of many individual array panels containing hundreds or thousands of sensors. Each of the sensor arrays is on the order of one to two inches on a side containing the pixels 400 and all the required sense and control lines 430 and bond pads. The individual one or two inch sensing arrays 404 are glued onto the phosphor 402 with the thinned epitaxial surface of the sensor array 400 facing the output surface of the phosphor 402. The other side of the phosphor 402 facing the x-rays is attached to the thin metal support plate 407. The sensor arrays 404 are precision machined so that they may be butted together as close as possible forming a gap between neighboring pixels 400 on adjacent arrays no larger than 200 microns. The individual pixels 400 on the sensing arrays 404 are placed on 50 to 100 micron centers with a capacitor size on the order of 25 to 50 microns on a side or thereabout.

The tab bonding 314 is positioned between the sensor arrays 404 and the preprocessors 302 so that it may connect to the preprocessors 302 and/or connect directly to the sensor arrays 404 through solder bumps 308.

The entire assembly comprising sensing arrays 404, phosphor 402, tab bonding 314 and preprocessors 302 attached to support plates 405 and 406 is placed in a mechanical housing 408 containing the necessary structural supports, stand offs and other necessary components for mechanical stability. The overall size of the cassette is on the order of 40 cm in the length and width dimensions and has a thickness on the order of one half inch. Ribbon connector 316 is attached to housing 408.

Figure 8:
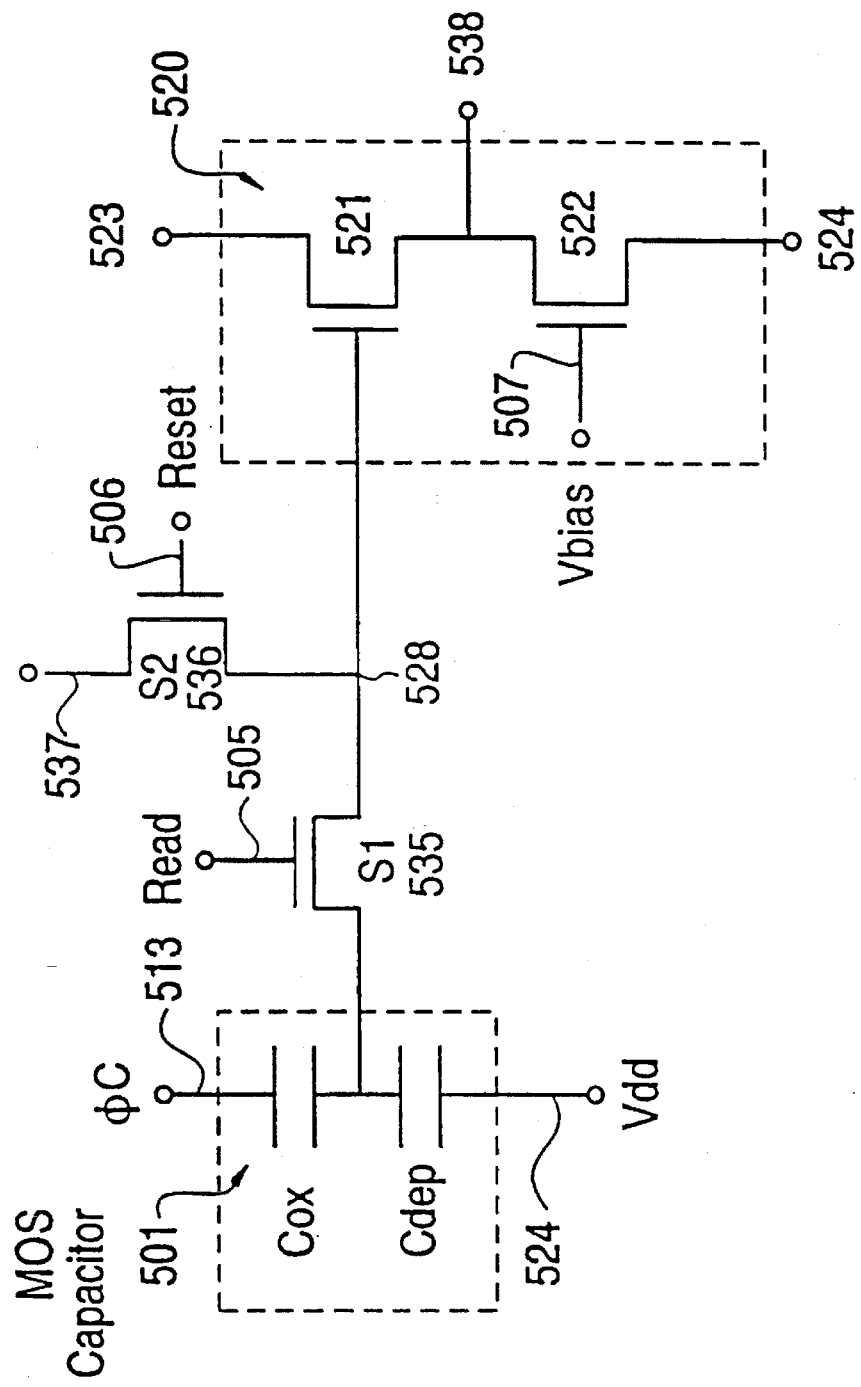
FIG. 8 is a schematic representation of the neighborhood readout amplifier according to a further embodiment of the present invention.

In the pixel architecture shown in FIG. 1, a gain stage 410 is used with each MOS capacitor 307 at the cost of fill factor and chip area. Although this pixel architecture is well suited for small area arrays and various imaging applications, it is not optimal for large area arrays. By using semiconductor device physics based techniques and the concept of charge conservation, the gain stage 410 can be replaced with a much smaller circuit. This circuit, a capacitively coupled dynamic source follower 520 can be shared by many MOS capacitors 501. A voltage gain is obtained by transferring charge from the MOS capacitor 501 to a smaller diffusion 528 which has a smaller intrinsic capacitance. This transfer results in a voltage change proportional to the ratio of the capacitor areas. The result is a pixel architecture which has high fill factor and avoids the problems of low charge transfer efficiency. A schematic representation of a single pixel 501 is shown in FIG. 8. The MOS capacitor (pixel) 501 is shown connected through an input switch 535 controlled by a read signal 505. The drain of said switch 535 is connected to the drain of another MOS transistor switch 536 controlled by a reset signal 506 and the input gate of the gain stage 520. The diffusion 528 that makes up the drains of switch 535 and 536 can be electrically isolated and is referred to as the "isolated" diffusion 528. The gain stage 520 consists of two transistors 521 and 522. The input transistor 521, has its drain connected to DC voltage VDD 523 and its gate connected to the floating diffusion 528 and its source connected to the drain of transistor 522. This is the output node Vout 538. The load transistor 522, has its drain connected to the source of transistor 521 and its gate connected to a DC bias voltage Vbias 507. Its source is connected to the DC voltage VSS 524.

Because the gain stage 520 is capacitively coupled, a number of MOS capacitors 501 can be connected to the input of the gain stage 520 without degrading the output signal. The electrical characteristics of the MOS capacitor 501 allow these capacitors to be charge coupled in such a way that they can serve as an analog shift register as well. By combining this technique with transistor switches 505 and 506 and the gain stage 520, many MOS capacitors 501 can be coupled to a single gain stage 520. This technique is commonly used in CCD (charge-coupled device) arrays. Operation of charge-coupled devices is well known and will not be discussed in detail here. The approach used in this embodiment differs from a standard CCD as follows:

1. The number of pixels 501 used is optimized to account for charge transfer losses and readout time.
2. The first row 551 of pixels 501 is clocked out and used as the output shift register 550 for the remaining pixels. This is accomplished by using an additional switch 503 between the first and second pixel 501 in each row 551 of the neighborhood 502.
3. The output gain stage 520 operation is dynamic thus consumes less power.
4. The pixel charge is read out in quasirandom random fashion which requires addressing circuitry on the back plane 700 to reconstruct the image.

Figure 9:
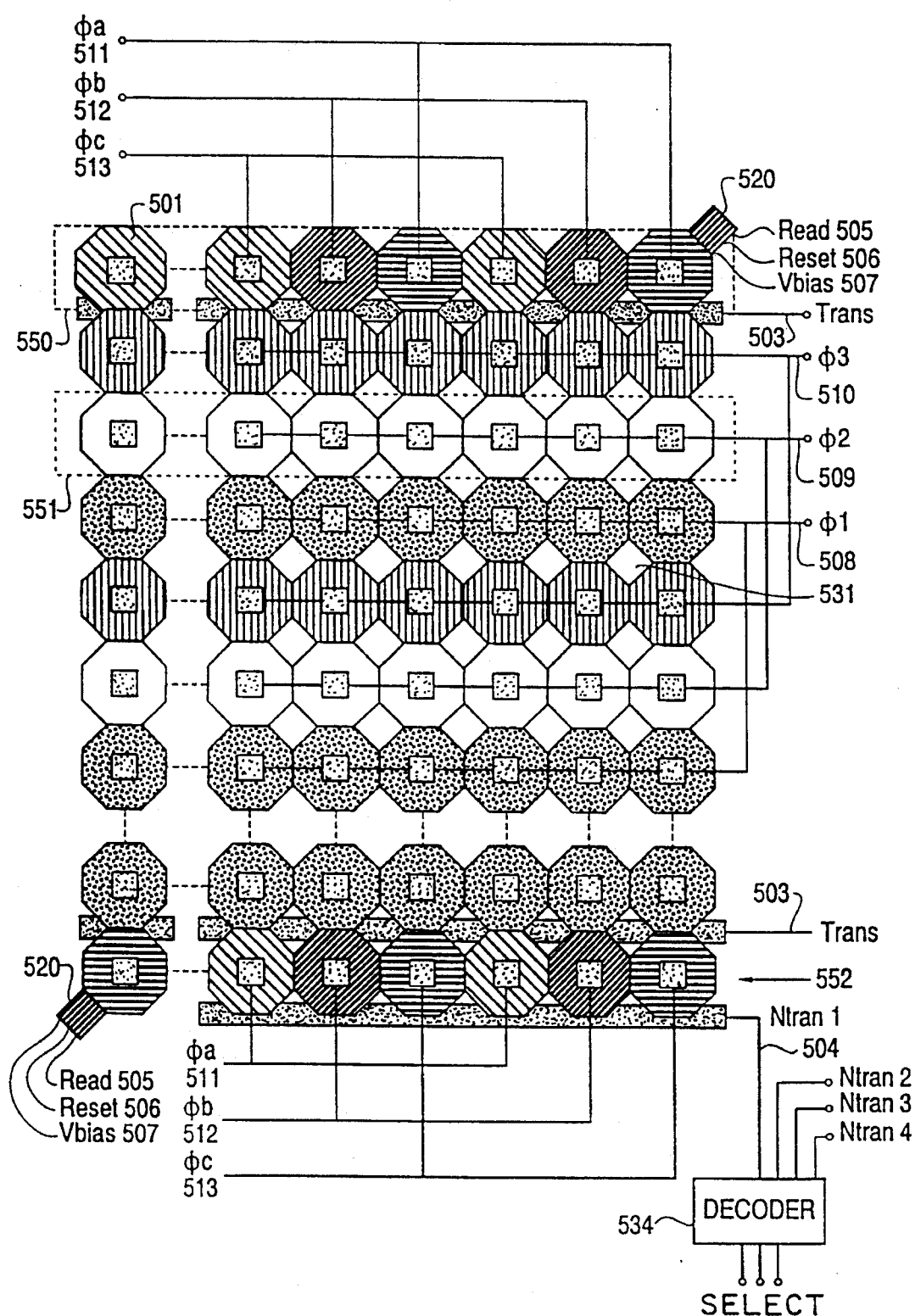
FIG. 9 is a plan view of an x-ray pixel neighborhood, the associated clock lines, the transfer gate, and the neighborhood readout amplifier according to a further embodiment of the present invention.

It is desirable to fabricate a large area array which has contiguous edge-to-edge sensing of the radiation field. In order to accomplish this, the non-imaging I/O circuitry 503, 504, 520 and 600 of the sensor tile must reside interstitially in the imaging area of the pixel array 560. If the associated I/O pads 600 and circuitry (gain stage 520, switches 505 and 506) take up space on the imaging plane a loss of resolution and/or dead spots may occur in the image produced by non-imaging components in the sensing array 560. FIG. 9 shows a collection of unique octagonal pixels 501 hereby referred to as a neighborhood 502. This octagonal pixel architecture is utilized to maintain high fill factor (93.4%) while allowing for adequate non-imaging area 531 between the pixels to construct peripheral I/O circuitry (gain stage 520, switches 505 and 506). Because the sensor array 560 is illuminated from the backside, metallized layers 532 can be fabricated over the polysilicon electrodes 526 and 527. Structures such as bond pads 600 can be formed above the pixel layer requiring minimal imaging area to implement.

Figure 10:
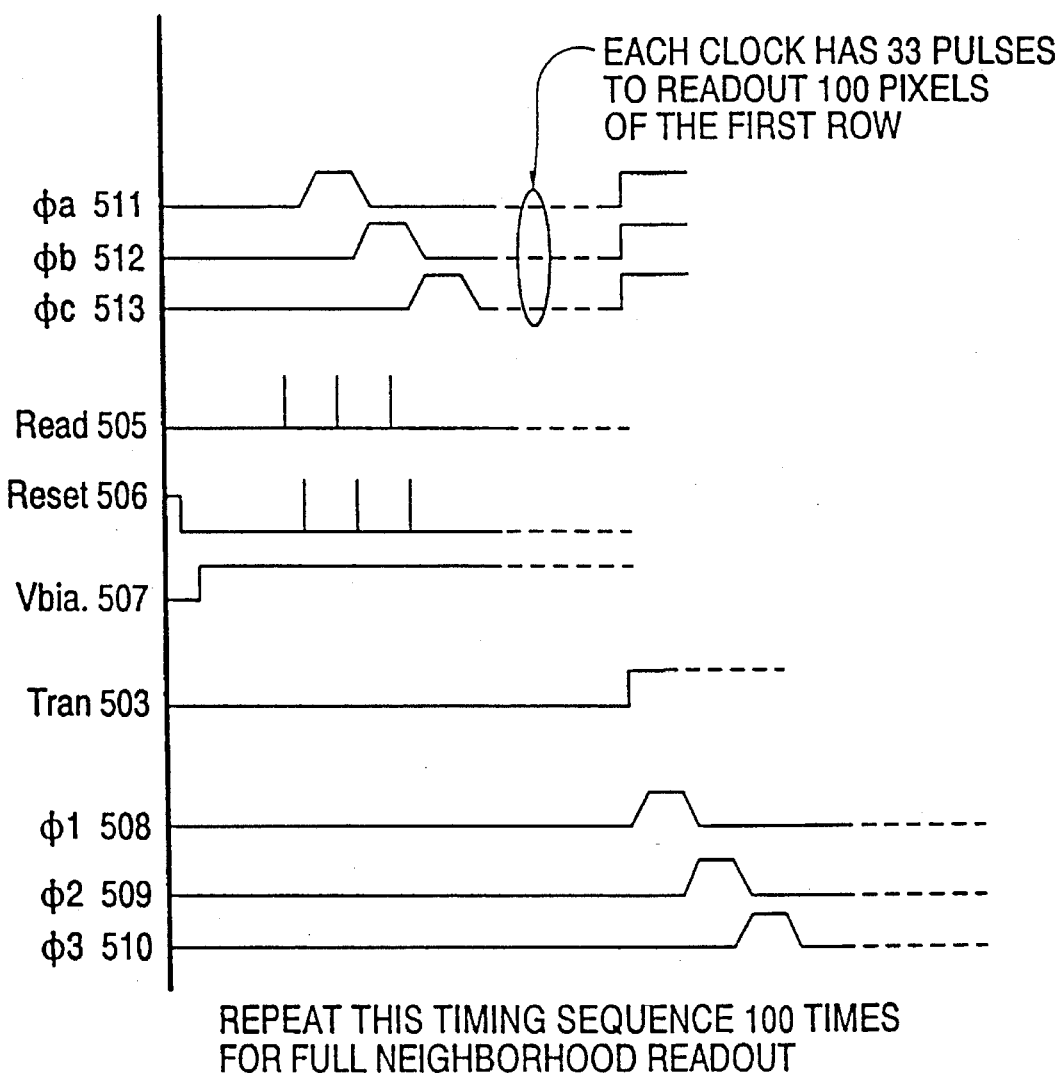
FIG. 10 is a timing chart for the charge-expose-read cycle of the neighborhood of FIG. 9.

In typical CCD arrays, the output shift register stages are smaller than the average pixel in order to facilitate fast read out of the imaging array. This smaller output shift register represents dead space which is non-imaging area. If a contiguous edge-to-edge image is desired then this approach is not suitable. In the embodied pixel architecture, the addition of a transfer gate 503 between the first row 550 and second row 551 of the neighborhood 502 is utilized to allow the first row 550 of imaging pixels 501 to be read out and once the image charge is transferred to the backplane 700 the first row 550 of pixels 501 is then used as an output shift register. This approach also requires a special clocking scheme that is shown in FIG. 10.

Figure 11:
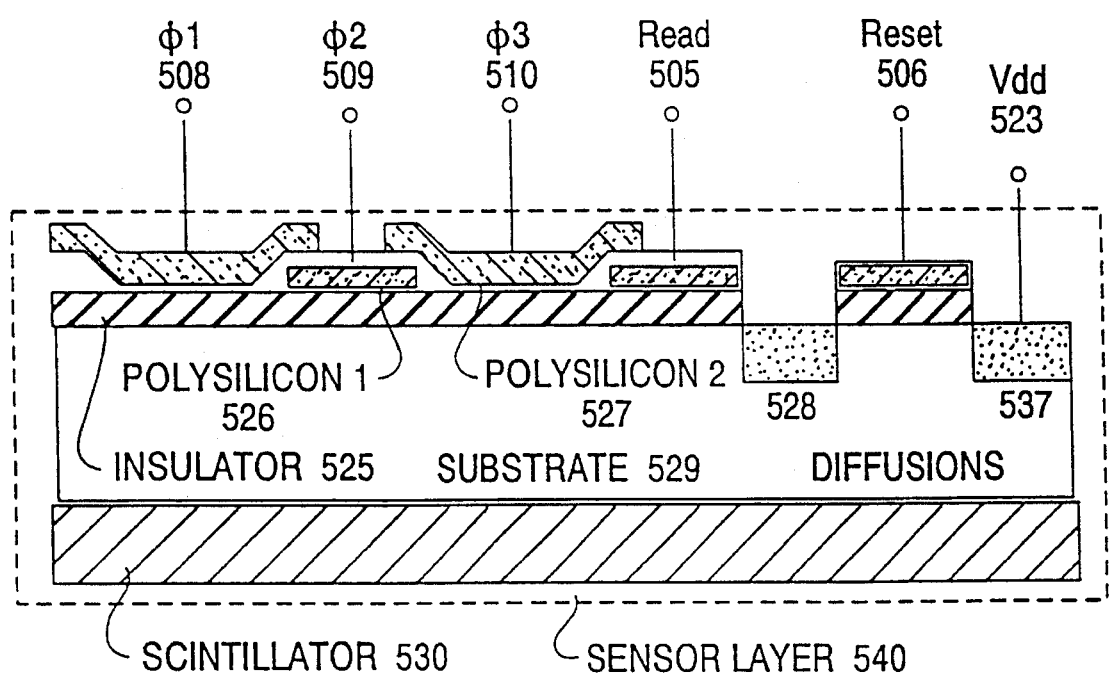
FIG. 11 is a cross sectional view of three pixels of the readout register, the transfer gate, and the readout amplifier for the neighborhood shown of FIG. 8 according to a further embodiment of the present invention.

Clocks 511, 512 and 513 are the horizontal transfer clocks, that are connected to the first row 550 of pixels 501 in each neighborhood 502. The transfer gate 503 is between the first row 550 and second row 551 of pixels 501 in the neighborhood 502. The transfer gate 503 is turned off and the horizontal clocks 511, 512, and 513 are cycled in non-overlapping fashion to move the charge induced by the x-ray flux to the neighborhood readout circuitry (gain stage 520, switches 505 and 506). When the last pixel 501 in the row 551 is read out the transfer gate 503 is turned on and clocks 511, 512 and 513 are left high. The vertical transfer clocks 508, 509 and 510 are then cycled such that each row 551 is shifted up one vertically. The first row 550 of pixels 501 has now been filled with image charge from the second row 551. This procedure is repeated until all the rows in the neighborhood 502 have been read out in a similar fashion. The output switches 505 and 506 function to switch the charge from the last pixel 501 in the first row 550 onto a very small floating diffusion 528. This floating diffusion 528 is capacitively coupled to the input of the gain stage 520 which acts to convert the collected charge to an analog voltage. After the charge is converted to an analog voltage, reset switch 506 is used to reset the potential of the floating diffusion 528 to Vdd 523 through diffusion 537. A cross section of three pixels and output gates used in the first row 551 as both imaging area and shift registers 550 are shown in FIG. 11. Each pixel shown in FIG. 11 consists of a MOS capacitor formed by a metallization layer 526, an insulator layer 525 and substrate 529 attached to scintillator 530.

Several pixels can be averaged together by allowing the vertical clocks 508, 509 and 510 to run a preset number of cycles before the horizontal clocks 511, 512 and 513 are cycled. This delay of the horizontal read out causes the charge of adjacent pixels 501 in the same row 551 to be added together. Horizontal addition is possible by cycling the horizontal clocks 511, 512 and 513 and switches 505 and 506 differently. In this manner, charge from adjacent column pixels is added together at the output diffusion 528. By combining these techniques any number of pixels can be averaged together to form a lower resolution image. By adding a transfer gate 503 and readout circuitry (gain stage 520, switches 505 and 506) to the bottom row 552 of the neighborhood 502, charge can be transferred bidirectionally through the array 560 by reversing the order of the horizontal clocks 511, 512 and 513 and the vertical clocks 508, 509 and 510. In the case of a defective row 551 of pixels 501, only that row 551 of information would be lost. If multiple rows 551 were defective the amount of data lost would be minimized. Use of transfer gates 504 between neighborhoods and a decoder circuit 534 to select such gates would allow pixel charge to by pass defective readout circuitry 600 thus adding fault tolerance to the sensor array 560.

The described pixel architecture lends itself to large scale arrays. The limitations of the size of large arrays is generally imposed by the defect rate of the semiconductor process used to implement the array. In order to produce 40 cm×40 cm arrays, 5 cm×5 cm "tiles" utilizing the pixel architecture described above will be implemented as edge-to-edge sensor layers 540 which can then be pieced together in mosaic fashion to construct larger sized arrays.

Figure 12:
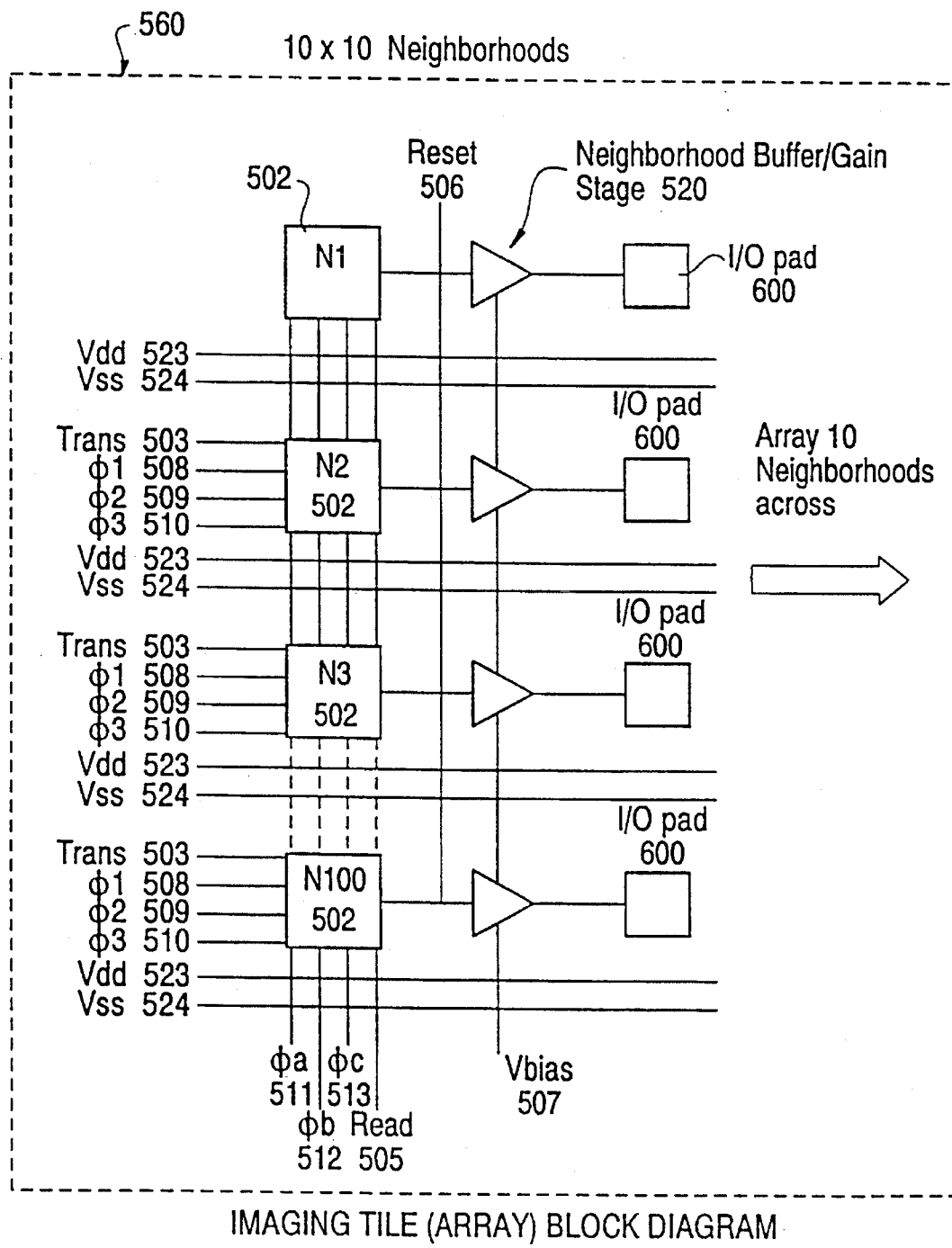
FIG. 12 is a plan view of the arrangement of neighborhoods on a 5 cm×5 cm tile.

FIG. 12 shows the floor plan of a single tile 560. There are 100 neighborhoods 502 arranged in a 10 by 10 array. Each neighborhood 502 has 10,000 octagonal MOS capacitors 501 arranged in a 100 by 100 array. Each neighborhood 502 has an I/O connection 600 to the backplane processing circuits, a gain stage 520 and a set of global signals that include vertical clocks 508, 509, 510; horizontal clocks 511, 512, 513; transfer gate 503 signal output switch signals 505 and 506, dc voltages 507, 523 and 524. By limiting the number of global signals the yield associated with fabricating the circuit is increased thus decreasing the price to fabricate the array. By limiting the number of pixels 501 per neighborhood 502, low charge transfer efficiency effects of the CCD structures are mitigated. The fact that each neighborhood 502 has its own gain stage 520 and I/O connection 600 allows the read out of the array 560 to be performed in parallel fashion using conventional clock speeds. Fault tolerance features are incorporated by using transfer gate 503 at the bottom of each neighborhood 502 and transfer gate 504 between each neighborhood 502 allows the life of the array 560 to be extended when used in an ionizing radiation field. Additional circuitry can be added to the interstitial spaces 531 between the pixels 501 in each neighborhood 502 to permit individual addressing of each neighborhood 502 which allows additional image processing and control capabilities. The use of additional readout circuitry and inter-neighborhood charge transfer gates may be utilized to extent useful operating lifetime of the detector array.

Exposure interval control of the array 560 can be accomplished by reading out one pixel 501 in each neighborhood 502 during exposure, every few milliseconds and comparing the pixel output level with a pre-set value to obtain optimum exposure interval to avoid over and under exposed images.

A design to package the sensor plane and the backplane post-processing circuitry is shown in FIG. 13. In this embodiment the sensor layer 540 is backlight as described above. The interconnect layers of the sensor plane are accessible from the side opposite the scintillator. I/O pads 600 are made using the last layer of metal in the IC process used to fabricate the sensor plane. Pretested IC's 701 are then mounted face down to these bond pads using solder. The thermal processing required for this step is minimal. Interconnection to the IC's 701 is facilitated by making the I/O pads 600 large enough to accommodate a wire bond 702. A ceramic substrate 700 with holes large enough to accommodate the IC's 701 on the sensor layer 540 is then mounted to said sensor layer 540. This substrate has metallization and wiring channels 703 fabricated before affixing it to the tile 560. The remaining connections to the I/O of the pre-tested IC's 701 and tile 560 are made using wire bonds 702. The signals are taken off the ceramic 700 through multiport connectors 704 which can be tied to a computer workstation. By using this technique, the area and power requirements of the gain stage 520 on the sensor layer 540 can be minimized.

Because of the parallel nature of the pixel I/O connections 600 to the backplane, post processing circuitry is necessary to properly address each pixel and display an image. The parallel circuit architecture also permits very high readout rates required to obtain high frame rates if needed. FIG. 14 shows a block diagram of the circuitry which will reside on the backplane of the detector. The neighborhood I/O pads 600 are first multiplexed through the input multiplexer 705 to four A/D convertors 706. Each A/D convertor 706 will receive 25 channels of data 720 and convert these analog signals to digital values. The PC interface 709 then allows address values to be passed via the PC address bus 717 to the address multiplexer 711 which then loads each pixel digital data word into the proper address in frame buffer "A" 713. The look-up table 712 can provide normalizing information about each pixel and can be used for certain image processing functions. The PC interface can be configured through PC control signals 716 to load the look-up table (LUT) 712. The LUT 712 is loaded through the LUT address bus 719. Data for the LUT is loaded through the PC data bus 718 and data buffer 710. The upper/lower decoder 708 is used in conjunction with the data multiplexers 707 to route the pixel data 720 to the proper location in frame buffer "A" 713. While frame buffer "A" 713 is being filled with data frame buffer"B" 714 can be displayed through digital I/O 721. All system timing is provided through system clocks 715.

The thick-film hybrid integration of the sensor tile 560 and the ceramic interconnect layer 700 shown in FIG. 13 does not provide support for the sensor tile 560 over its entire surface area. Moreover, electrical connections between the data processor ICs 701 and the bond pads 600 on the sensor tile 560 are made on the sensor tile creating an opportunity to damage the sensor tile during the wire bonding process.

Figure 15:
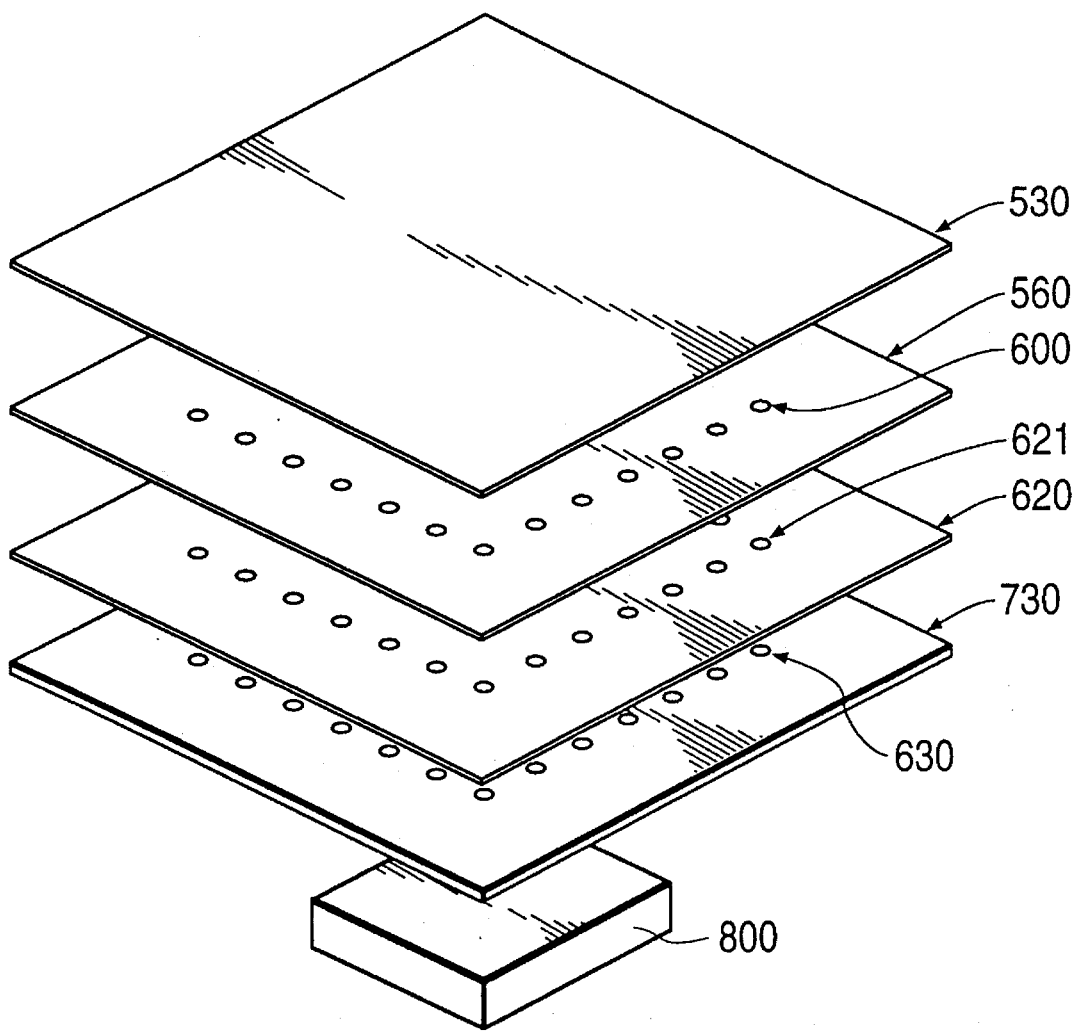
FIG. 15 is an exploded view of a 5 cm×5 cm sensor tile according to a further embodiment of the present invention.
Figure 17:
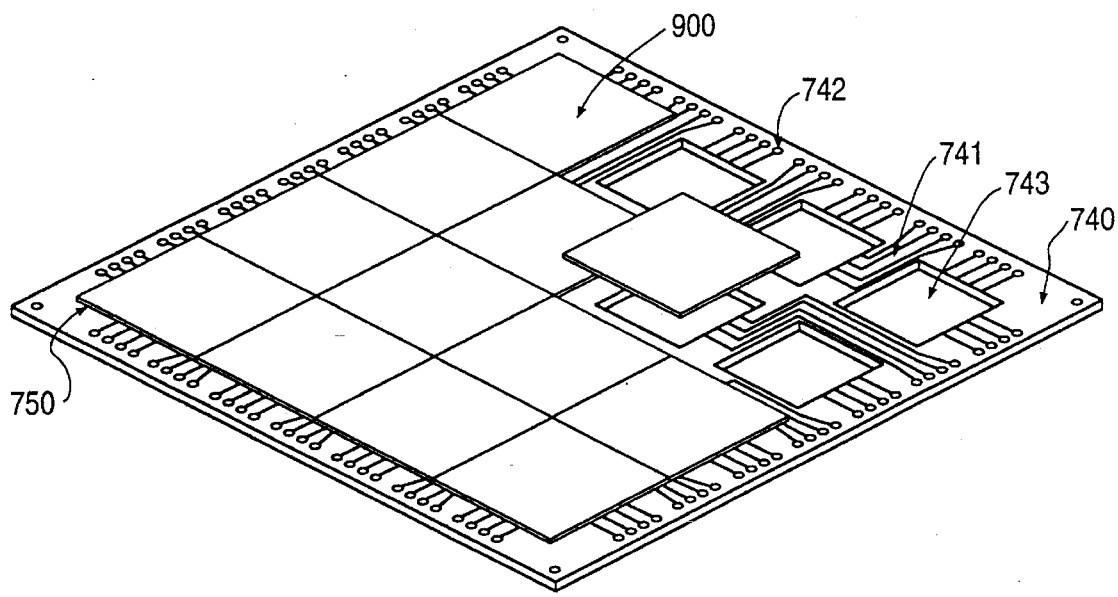
FIG. 17 is an isometric drawing of a 20 cm ×20 cm detector array comprising sixteen 5 cm×5 cm sensor tiles and a ceramic backplane containing an array of through holes and a metallization layer according to a further embodiment of the present invention.

In accordance with an improved embodiment of the present invention shown in FIGS. 15–17, the ceramic interconnect layer 700 is replaced with a ceramic substrate 730 that has no open areas so that it can support the sensor tile 560 over its entire area. The data processing ICs 701 are replaced by application specific integrated circuit (ASIC) processor arrays 800 to simplify the circuitry needed to drive the sensor tiles 560. The ASIC incorporates all of the timing, processing and control circuitry needed for one sensor tile in a single integrated circuit. The electrical connections between the bond pads 600 on the sensor tile 560 and the ASIC processor arrays 800 are made using conductive epoxy or by conductive vias 630 through the ceramic substrate 730.

FIG. 15 shows an exploded view of a single thick film hybrid detector assembly 900. The assembly 900 consists of a scintillator 530, a sensor tile 560 having bond pads 600, an epoxy preform 620 containing an array of epoxy conductors 621 in a pattern to match the bond pads 600 on the sensor tile 560 and a ceramic substrate 730 containing an array of conductive vias 630 which are aligned with the epoxy conductors 621 and bond pads 600.

The sensor tile 560 consists of an array of MOS capacitors or the like. The scintillator 530 illuminates the MOS capacitors through a thinned epitaxial layer of sensor tile 560. As shown in FIG. 17, an imaging matrix 750 is formed by placing many detector assemblies 900 adjacent one another with the gap between adjacent scintillators 530 and sensor tiles 560 being less than 50 microns. Alternatively, in place of individual scintillator for each assembly 900, a single large-area scintillator may cover all of the sensor tiles 560 of a single imaging matrix illuminating the sensor tiles 560 through a thinned epitaxial layer of the sensor tiles.

The use of an epoxy preform 620 allows a uniform thickness of epoxy to be applied to the sensor tile 560 and provides for precision patterning of the conductive epoxy required to contact the bond pads 600 on sensor tile 560 to the conductive vias 630 on ceramic substrate 730. An alternative to the epoxy preform is to apply a patterned layer of conductive and non-conductive epoxy on either the sensor tile 560 or the ceramic substrate 730 prior to assembling the hybrid assembly 900. The principal concern is the avoidance of entrapped air in the epoxy layer during assembly that could weaken the bond and or prevent good electrical contact.

It is important that all materials used in the thick-film hybrid assembly 900 have similar thermal coefficients of expansion. Many applications of the x-ray imaging system will require cooled operation to provide extended integration times. Cooling the assembly 900 could cause delaminations, stresses and damage to the assembly 900 if all of the components do not contract and expand similarly. There are a variety of epoxy materials commercially available that have sufficient elasticity to accommodate mismatches in the thermal expansion differences between the epoxy, silicon and ceramic materials. Elasticity in the epoxy avoids placing stress on the silicon and ceramic materials due to the differences coefficients of expansion of these materials. In addition, ceramic materials such as aluminum nitride which have thermal expansion coefficients close to silicon may be used.

It is also important that the individual sensor tiles 560 and the ceramic substrates 730 have very close tolerances on their outside dimensions so that they can be placed as close as possible together in forming the imaging matrix 750. Ideally, the scintillators 530 and sensor tiles 560 of adjacent assemblies 900 can be placed within 50 microns to each other. This way a seam one pixel wide will be created between the tiles. In the composite image, the missing pixels can be filled in through the use of interpolating techniques.

The sensor tiles 560 of the present invention each contain an array of one million MOS capacitors 307 in a square matrix divided up into 4 neighborhoods 502 comprising a 500 by 500 array of MOS capacitors as discussed above in connection with FIG. 9. Each neighborhood 502 is independently addressed and driven by an ASIC processor array 800 in a manner as discussed above.

FIG. 16 shows one assembly 900 inverted relative to FIG. 15. The ceramic substrate 730 includes a metallization layer forming conductors 731, 732 and 733. Conductors 731 provide an external connection to the sensor tile through conductive vias 630 in order to provide reference voltages and the like to the sensor tile 560. Conductors 732 provide an external connection to the ASIC processor 800 in order to allow for input and output from the ASIC. Conductors 733 provide a connection between the ASIC processor 800 and the sensor tile 560 through conductive vias 630. The ASIC processor array contains the required circuitry to provide clock signals and bias voltage levels required to operate the sensor array 404 contained in sensor tile 560.

FIG. 17 shows the imaging matrix 750 which comprises an array of detector assemblies 900 arranged in a mosaic pattern on a ceramic backplane 740. The ceramic backplane 740 provides mechanical support for the sensor tiles 560 and contains a metallization layer 741, an array of bond pads 742 and an array of through holes 743. The through holes 743 allow the ASIC processor arrays 800 to protrude through the ceramic backplane 740 allowing direct contact between the conductors formed by metallization layer 741 on the backplane 740 and corresponding conductors 731 and 732 on the ceramic substrates 730. The conductors of metallization layer 741 are soldered to the conductors 731 and 732 in a similar fashion as surface mount devices on a printed circuit board or other means as would be obvious to one skilled in the art.

The metallization layers 741 terminate in an array of bond pads 742 on the ceramic backplane 740. The bond pads 742 can be attached to pins that can be connected to ribbon cables or they can be connected by laminated conductors such as TAB bonding to an external image management system.

One advantage to this embodiment is that individual assemblies 900 can be removed from the matrix 750 if they become defective during assembly or use. A large imaging matrix 750 can be made from smaller sensor tiles 560 that can be made in any silicon foundry with CCD or other similar processing capability. Individual sensor tiles 560 can be preyielded and assembled in a larger matrix.

Figure 18:
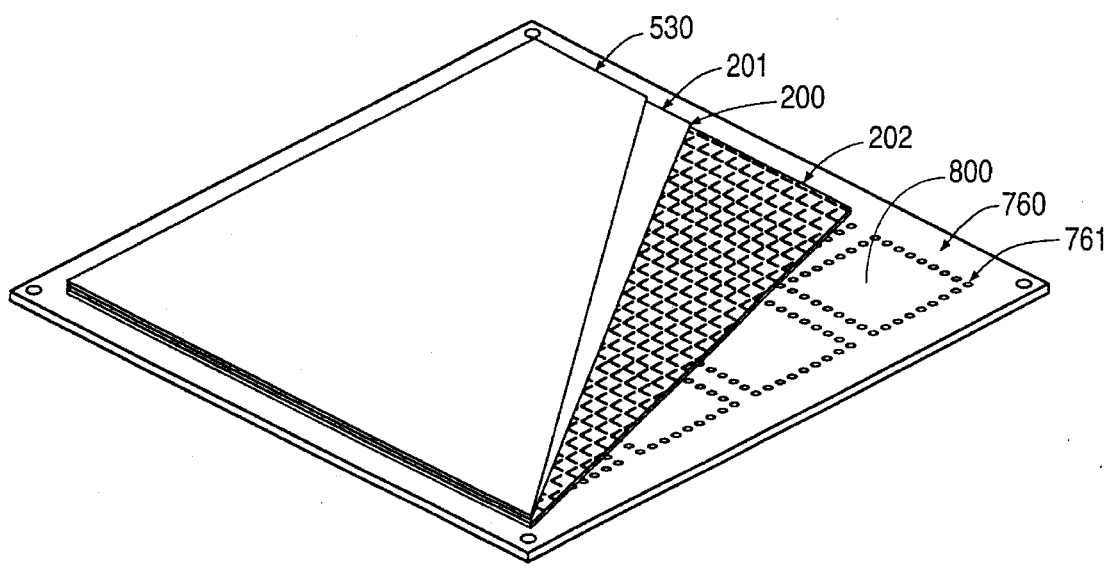
FIG. 18 is an isometric drawing of the detector array comprising a scintillator; a silicon on insulator substrate containing a plurality of charge storage devices and a ceramic backplane containing a metallization layer and bump bonds according to a further embodiment of the present invention.

In yet another embodiment of the improved thick-film hybrid integration method, the array of sensor tiles 560 and ceramic substrates 730 is replaced by a monolithic silicon-on-insulator substrate 200 comprising a transparent insulator layer 201 and silicon layer 202 shown in FIG. 18. Also shown in FIG. 18 is the scintillator 530 attached to the insulator layer 201 which is in turn attached to the silicon detector layer 202. The silicon detector layer 202 is connected to a single ceramic backplane 760 by epoxy and an array of conductive vias 761.

The silicon detector layer 202 contains an array of 5 cm×5 cm pixel patterns very similar to the pixel architecture of the individual sensor tiles 560 of the present invention. The silicon detector layer 202 has the advantage of not having seams between the individual tiles and the subsequent loss of imaging capability in those seams. The thickness of the sensor layer 202 needs to be less than 100 microns since the pixels 501 are illuminated from the back side. This requirement makes it practical to fabricate large area silicon arrays with existing CVD and other thin film processes as would be obvious to anyone of ordinary skill in the art.

One advantage of this embodiment is that there are no gaps between the individual sensor tiles 560. The entire imaging matrix 750 contains a contiguous pixel matrix without interruption. Several steps in the manufacturing process are eliminated with this approach compared with the tile mosaic of the previous embodiment. Specifically, there is no need to saw the individual tiles from wafers and the tiles do not need to be thinned since the silicon layer of the present embodiment is produced at the appropriate thickness. However, the insulating layer 201 of substrate 200 that is between the scintillator 530 and the silicon layer 202 will disperse the visible light emitted by the scintillator 530 reducing the resolution of the system. Therefore, the total thickness of the insulator layer 201 must be less than 50 microns, unless a scintillating phosphor can be doped in the insulating layer 201. In this case, the layer can be much thicker without compromising resolution, as discussed below with reference to FIG. 21.

FIG. 21 shows a further embodiment of the present invention which has the same construction as that shown in FIG. 18 except that the scintillator layer 530 and insulator layer 201 of FIG. 18 have been combined into a glass substrate 3 providing a high density phosphor screen that also serves as the insulating substrate for the silicon detector layer 202. A doped glass scintillator which can be used for layer 203 is sold by Industrial Quality, Inc. of Gaithersburg, Md. as part number IQI 301 and IQI 302.

Figure 19:
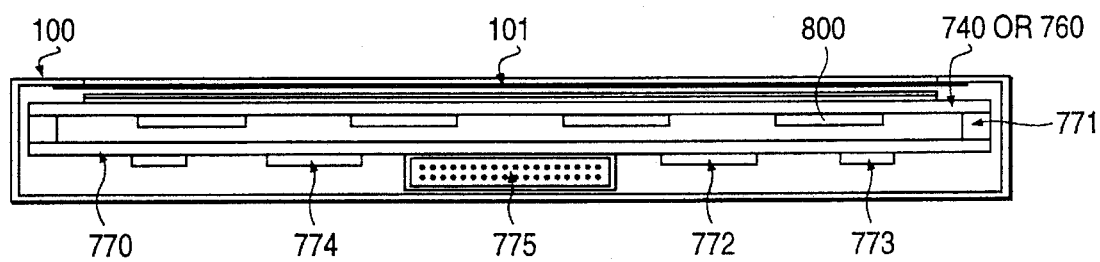
FIG. 19 is a cross sectional view of the detector array according to the present invention.

FIG. 19 shows a cross sectional view of the detector housing 100 of the improved detector design of the present invention. The top of the housing 100 contains a thin window 101 made of low Z metal such as beryllium or aluminum to allow x rays to penetrate yet provide isolation and protection for the electronic circuitry inside. The ceramic backplane 740 or 760 is connected to a printed circuit board backplane 770 by edge connectors 771. The ceramic backplane 770 contains an array of analog-to-digital converters 772, frame buffers 773 and processing circuits 774. These circuits are connected by metallization layers to a ribbon connector 775.

Figure 20:
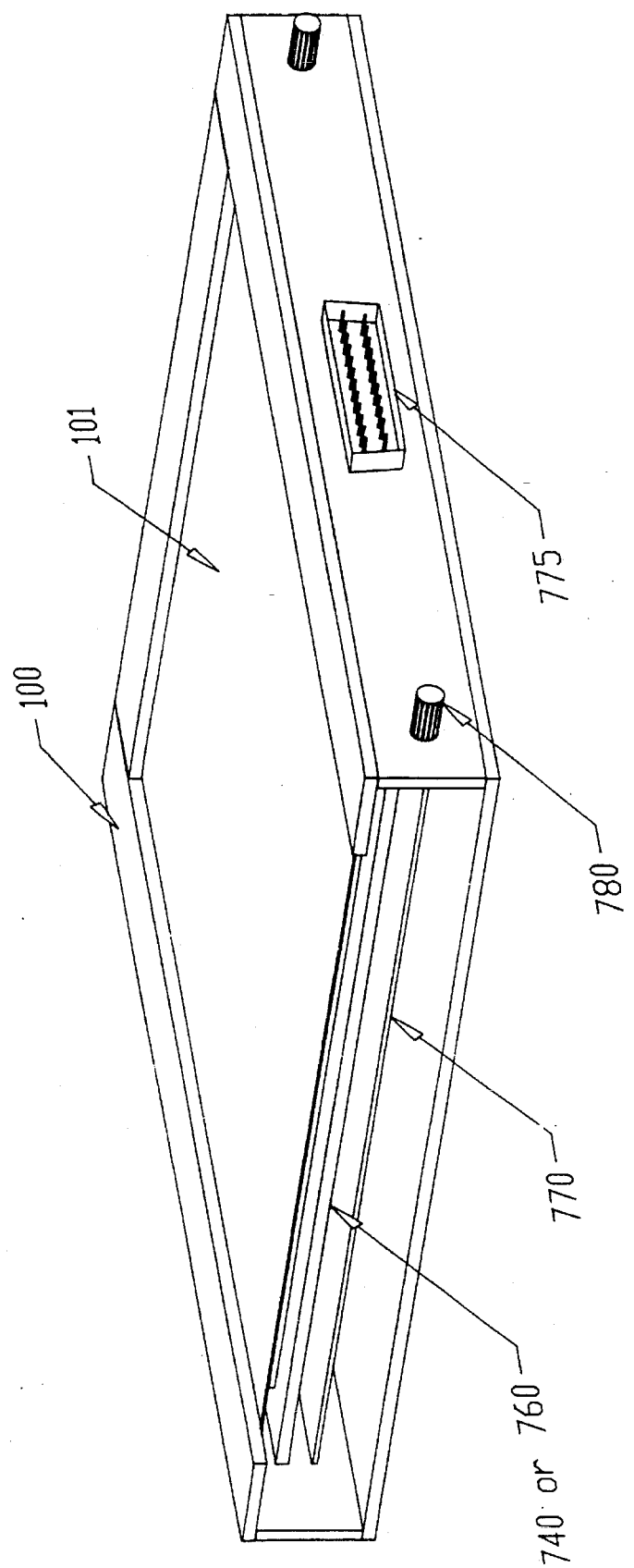
FIG. 20 is an isometric drawing of the detector array according to a further embodiment of the present invention.

FIG. 20 shows a isometric cut-away view of yet another embodiment of the present invention. The detector housing 100 is hermetically sealed to prevent moisture from damaging the electronic circuitry and scintillator 530. The housing 100 has fittings 780 to allow a coolant such as Xenon or Nitrogen to be flowed through the housing 100 to cool the electronics within allowing for improved imaging performance and extending the integration time of the sensor array 404.

To facilitate image processing, the outputs from the sensor arrays 800 may be read in parallel and converted to a single video signal for driving a single image display device using the circuitry disclosed in U.S. Pat. No. 5,159,455, the disclosure of which is incorporated by reference herein.

The foregoing description is provided for purposes of illustrating the present invention but is not deemed limitative thereof. Clearly, numerous additions, substitutions and other changes can be made to the invention without departing from the scope thereof as set forth in the appended claims.

What is claimed is:

1. An x-ray imaging sensor, comprising:

a scintillator layer for converting impinging x-rays into visible light;

a plurality of sensor tiles, each of said sensor tiles having an array of sensors for receiving visible light from said scintillator layer and converting said visible light into an electrical signal;

a plurality of substrates for supporting, respectively, said plurality of sensor tiles;

a plurality of processor arrays connected, respectively, to said plurality of substrates for processing signals from said sensor tiles, each of said substrates being larger than the sensor tile to which it is connected and having a periphery which extends beyond the periphery of the sensor tile to which it is connected, and a metallization layer on each of the substrates, said metallization layer providing an electrical connection to said processors; and a backplane having openings for receiving said processor arrays, said substrates extending beyond said openings to be supported by said backplane, said backplane having a metallization layer for connecting to the metallization layers on the substrates.

2. An apparatus as claimed in claim 1 wherein said scintillator layer comprises a single large-area scintillator covering all of said plurality of sensor tiles of said x-ray imaging sensor.

3. An apparatus as claimed in claim 2 wherein said single large-area scintillator illuminates said plurality of sensor tiles through a thinned epitaxial layer of each said array of sensors.

4. An apparatus as claimed in claim 1 wherein the sensor tiles are mounted on one side of the substrates and the processor arrays are mounted on an opposite side of said substrates, and wherein each substrate has conductive vias for connecting the sensor tile mounted on that substrate to the processor array on that substrate.

5. An apparatus as claimed in claim 1 wherein said plurality of processor arrays are ASIC processor arrays.

6. An apparatus as claimed in claim 1 wherein said plurality of sensor tiles are arranged in a mosaic pattern on said backplane.

7. An apparatus as claimed in claim 1 wherein said plurality of sensor tiles are removable.

8. An apparatus as claimed in claim 1 wherein said backplane is connected to a printed circuit board backplane by an edge connector.

9. An apparatus as claimed in claim 8 wherein said printed circuit board backplane further includes analog-to-digital converters and frame buffers.

10. An apparatus as claimed in claim 1 further including a mechanical housing unit for providing mechanical support for said x-ray imaging sensor.

11. An apparatus as claimed in claim 10 wherein said mechanical housing unit contains fittings to allow coolant to flow through said mechanical housing unit to cool said plurality processor arrays and said x-ray imaging sensor.

12. An apparatus as claimed in claim 10 wherein said mechanical housing unit is hermetically sealed to prevent moisture from damaging said x-ray imaging sensor.

13. An apparatus as claimed in claim 1 wherein said metallization layer of said backplane terminates in an array of bond pads on said backplane.

14. An apparatus as claimed in claim 13 wherein said array of bond pads is attached to pins, said pins being connected to a ribbon cable.

15. An apparatus as claimed in claim 13 wherein said array of bond pads is attached to pins, said pins being connected to laminated conductors, said laminated conductors being connected to a data processing unit.

16. An apparatus as claimed in claim 13 wherein said array of bond pads is attached to pins, said pins being connected to TAB bonding, said TAB bonding being connected to a data processing unit.

17. An apparatus as claimed in claim 4 wherein each of said sensor tiles has an array of bond pads connected to said conductive vias by an epoxy preform having epoxy conductors, said epoxy conductors having a pattern for connecting said array of bond pads to said conductive vias.

18. An apparatus as claimed in claim 1 wherein said scintillator layer comprises a plurality of scintillators attached, respectively, to said plurality of sensor tiles.

19. An x-ray imaging sensor, comprising:
a scintillator for converting impinging x-rays into visible light;
a monolithic silicon-on-insulator substrate having a transparent insulator layer and a silicon detector layer for detecting visible light and producing electrical signals in response thereto;
a plurality of processor arrays connected to said monolithic silicon-on-insulator substrate for processing signals from said silicon detector layer; and
a backplane having conductive vias for connecting said backplane to said silicon detector layer.

20. An apparatus as claimed in claim 19 wherein said silicon detector layer is connected to said backplane conductive vias by an epoxy.

21. An apparatus as claimed in claim 19 wherein said silicon detector layer has a thickness no greater than 100 microns.

22. An apparatus as claimed in claim 19 wherein said insulator layer has a thickness no greater than 50 microns.

23. An apparatus as claimed in claim 19 wherein said insulator layer is doped with a scintillating phosphor.

24. An apparatus as claimed in claim 19 further including a mechanical housing unit for providing mechanical support for said x-ray imaging sensor.

25. An apparatus as claimed in claim 24 wherein said mechanical housing unit has a thin window made of low Z metal for allowing x-rays to penetrate said thin window and for protecting said x-ray imaging sensor.

26. An apparatus as claimed in claim 24 wherein said mechanical housing unit contains fittings to allow coolant to flow through said mechanical housing unit to cool said x-ray imaging sensor.

27. An apparatus as claimed in claim 24 wherein said mechanical housing unit is hermetically sealed to prevent moisture from damaging said x-ray imaging sensor.

* * * * *